US010847395B2

(12) United States Patent
Woo et al.

(10) Patent No.: US 10,847,395 B2
(45) Date of Patent: Nov. 24, 2020

(54) WAFER STORAGE CONTAINER

(71) Applicants: PICO & TERA CO., LTD., Suwon (KR); Bum Je Woo, Seongnam (KR)

(72) Inventors: Bum Je Woo, Seongnam (KR); Seok Mun Yoon, Suwon (KR); Myoung Sok Han, Yongin (KR); Hyun Sin Kim, Cheonan (KR)

(73) Assignees: PICO & TERA CO., LTD., Suwon (KR); Bum Je Woo, Seongnam (KR)

( * ) Notice: Subject to any disclaimer, the term of this patent is extended or adjusted under 35 U.S.C. 154(b) by 177 days.

(21) Appl. No.: 16/064,950

(22) PCT Filed: Dec. 21, 2016

(86) PCT No.: PCT/KR2016/014987
§ 371 (c)(1),
(2) Date: Jun. 21, 2018

(87) PCT Pub. No.: WO2017/111451
PCT Pub. Date: Jun. 29, 2017

(65) Prior Publication Data
US 2018/0374731 A1    Dec. 27, 2018

(30) Foreign Application Priority Data

Dec. 24, 2015    (KR) ........................ 10-2015-0186010

(51) Int. Cl.
*H01L 21/673* (2006.01)
*H01L 21/67* (2006.01)

(52) U.S. Cl.
CPC .. *H01L 21/67389* (2013.01); *H01L 21/67017* (2013.01); *H01L 21/6732* (2013.01); *H01L 21/67393* (2013.01); *H01L 21/67383* (2013.01)

(58) Field of Classification Search
CPC ......... H01L 21/67017; H01L 21/67389; H01L 21/67393
See application file for complete search history.

(56) References Cited

U.S. PATENT DOCUMENTS 5,988,233 A * 11/1999 Fosnight ........... H01L 21/67393
141/63
7,235,138 B2 * 6/2007 Zheng ............... C23C 16/45546
118/725

(Continued)

FOREIGN PATENT DOCUMENTS

JP      2012114133 A     6/2012
JP       5361805 B2     12/2013

(Continued)

OTHER PUBLICATIONS

International Search Report for International Patent Application No. PCT/KR2016/014987, dated Mar. 28, 2017.

*Primary Examiner* — Mollie Impink

(57) ABSTRACT

The present invention relates to a wafer storage container, more particularly, relates to a wafer storage container comprising a storage chamber forming an independent space separated from the wafer storage container, and a plurality of gas chambers communicating with the storage chamber, so that the gases are being supplied or exhausted through the area of the side surfaces of the storage chamber via the gas chambers in order to remove the fumes remaining on the surface of a wafer stored inside the wafer storage container efficiently.

14 Claims, 11 Drawing Sheets

(56) References Cited

U.S. PATENT DOCUMENTS

2015/0107770 A1* 4/2015 Choi ................. H01L 21/67017
156/345.29
2015/0243538 A1* 8/2015 Miyajima ......... H01L 21/67772
206/711

FOREIGN PATENT DOCUMENTS

| KR | 10-2000-0019931 A | 4/2000 |
| --- | --- | --- |
| KR | 10-1075171 B1 | 10/2011 |
| KR | 10-1366135 B1 | 2/2014 |
| KR | 10-1444241 B1 | 9/2014 |

* cited by examiner

WAFER STORAGE CONTAINER

CROSS-REFERENCE TO RELATED APPLICATIONS

The present specification is a U.S. National Stage of International Patent Application No. PCT/KR2016/014987 filed Dec. 21, 2016, which claims priority to and the benefit of Korean Patent Application No. 10-2015-0186010 filed in the Korean Intellectual Property Office on Dec. 24, 2015, the entire contents of which are incorporated herein by reference.

TECHNICAL FIELD

The present invention relates to a wafer storage container, more particularly, to a wafer storage container efficiently removing fumes remaining on the surface of a wafer.

BACKGROUND

Generally, a semiconductor device is manufactured by selectively and repeatedly performing processes of vacuum deposition, polishing, photolithography, etching, ion implementation, cleaning, inspection, heat treatment, and the like on a wafer; and this wafer is transported to a specific location required for each process to be formed as a semiconductor device.

During the semiconductor manufacturing processes, since the wafer being processed is a high precision item, it is stored in a wafer storage container like a front opening unified pod (FOUP) and transported, so that it is protected from the contamination or damages caused by the external contamination material and the impact thereto when it is stored and transported.

In this situation, the process gases used in the processes, the fumes which are the byproducts of the processes, and the like are not removed, but instead, being stored in the wafer storage while remaining on the surface of the wafer.

However, there is a problem in that when the processes are proceeded with such residues adhered on the surface of the wafer, it leads to the contamination of the manufacturing equipments, the failures in the etch pattern, and the like, thereby eventually causing degradation in the reliability of the products.

Recently, in order to solve such problems, technologies are being developed for removing fumes remaining on the surface of the wafer using a gas supplied from a load port by combining the load port with the wafer storage container wherein the wafer is stored; and such wafer storage container are publicly disclosed in the patent literatures: Korea Registered Patent No. 1366135 (hereinafter referred to as "Patent Literature 1"); and Japanese Laid-open Patent Publication No. 2012-004199 (hereinafter referred to as "Patent Literature 2").

The post purge system of Patent Literature 1 comprises: a wafer storage unit; a plurality of spray tubes wherein a plurality of spray nozzles are formed; a fume removal unit comprising a tube connected to the plurality of spray tubes; and a fume exhausting unit, so that a first gas is supplied along the supply tube and flowed into the plurality of spray tubes and thereafter sprayed towards the wafers stored in the wafer storage unit through the plurality of the spray nozzles.

However, in the case of a post purge system of Patent Literature 1, the spray pressure of the first gas being sprayed from the spray tube, among the spray tubes plurally disposed along the vertical lengthwise direction, located at the most remote end from the supply tube is relatively lower than the spray pressure being sprayed from the other spray tubes, and since the spray pressure of the first gas being sprayed at the upper and lower sides of the spray tube is also relatively lower than the spray pressure of the first gas being sprayed from the center area of the spray tube wherein the supply tube is connected, there is a problem in that the first gas cannot be sufficiently sprayed towards the front, downward, and upward directions of the wafer storage container.

Since the first gas is sprayed in a kind of straight line method through the spray tubes, the first gas is not sprayed in the region wherein the spray tubes are not disposed inside the wafer storage container therefore the first gas is intensively sprayed only in the region where the spray tubes are disposed. Therefore, dead zone wherein the fumes on the wafer cannot be removed may be occurred; however, if the number of spray tubes is increased to solve this problem, the difference in the spray pressures of the first gas becomes larger; thus, there is a problem in that the spraying of the first gas towards the front, downward, and upward directions of the wafer storage unit becomes more difficult.

As the post purge system is used for a long period time, fumes are continuously contacted to the fume removing unit causing contamination and corrosion of the fume exhausting unit, thus consequently, cleaning or replacement thereof becomes necessary; however, according to the configuration of the post purge system, the cleaning and replacement of the fume exhausting unit cannot be easily accomplished, therefore there is a problem in that the lifetime of the post purge system may be reduced.

The substrate storage container of Patent Literature 2 comprises: a container body; a pair of gas supply valves and a pair of gas exhausting valve formed in a bottom plate of the container body for flowing an inert gas, and has a configuration wherein the gas supply valve is located in a space surrounded by a curved projection of the container body, a sidewall, and a surrounding piece of a support body.

Thus, according to the aforementioned substrate storage container, when an inert gas is introduced into the space through a pair of gas supply valves, the inert gas is flowed towards the wafer through the outlets formed between the plurality of rear columns and the plurality of rear support pieces, or gaps formed between the back side support pieces neighboring up-down direction, and thereafter exhausted through a pair of exhausting valves formed in front of the bottom plate of the container body.

However, the substrate storage container of Patent Literature 2 has a problem in that since the inert gas is supplied only from the backside region of the wafer, a dead zone wherein the fumes of the wafer cannot be removed may occur in front of the wafer.

The inert gas is simply introduced into the space and merely flowing through the outlets or the gaps, and thus, there are problems in that the inert does not have a pressure and a flow rate sufficient enough to directly remove the fumes remaining on the surface of the wafer, and it cannot be sufficiently flowed to the center region of the wafer.

Since the inert gas that has removed the fumes of the wafer is being exhausted by a pair of exhausting valves formed in front of the bottom plate, the gas can be intensively exhausted only through a part of the region close to the exhausting valves, and thus, there is problem in that the exhausting of the inert gas and the fumes cannot be smoothly accomplished.

A kind of turbulence in the flow of the inert gas inside the storage container body may be formed because the inert gas is supplied only through a part of the region, and being exhausted only through a part of the region; and due to such reasons, not only the uniform supply and exhaust of the inert gas cannot be accomplished but also the flow of the inert gas in the rear and front regions with respect to the wafer cannot be smoothly accomplished, therefore there is a problem in that the fume removal efficiency for the wafer is being degraded.

PATENT DOCUMENTS

1. Korea Registered Patent No. 1366135
2. Japanese Laid-Open Patent Publication No. 2012-004199

SUMMARY

An objective of the present invention devised to solve the above mentioned problems is provide a wafer storage container for efficiently removing the fumes remaining on the surface of a wafer by supplying and exhausting the gas through the area of the side surfaces of the storage container through the gas chamber.

A wafer storage container according to an exemplary feature of the present invention is characterized in that and comprises:

a storage chamber wherein the wafers are stored;

a gas hole located in the lower side of the storage chamber; and a gas chamber communicating with the gas holes, located in the outer side surface of the storage chamber so as to be communicating with the storage chamber.

It is characterized in that the gas chamber comprises a plurality of gas chambers; the gas hole comprises a plurality of gas holes;

at least one of the gas chambers supplies gas to the storage chamber; and at least one of the gas chambers exhausts gas from the storage chamber.

Also, it is characterized in that the gas chamber comprises a plurality of gas chambers; the gas hole comprises a plurality of gas holes; and at least two of the gas chambers are commonly communicating with one of the gas holes.

Also, it is characterized in that a communicating hole communicating with the gas hole is formed in the lower side of each gas chamber.

Also, it is characterized in that a pathway connecting the gas hole and the gas chamber is formed in the lower side of the storage chamber.

Also, it is characterized in that the gas hole comprises: a pair of front gas holes located in the front with respect to the center point of the wafer stored in the storage chamber; and a pair of rear gas holes located in the rear with respect to the center point of the wafer stored in the storage chamber.

Also, it is characterized in that the gas chamber comprises: a first and a second gas chambers located respectively in the front left and the front right of the outer side surface with respect to the center point of the wafer stored in the storage chamber; a third and a fourth gas chambers located respectively in the rear left and the rear right of the outer side surface with respect to the center point of the wafer stored in the storage chamber; and a fifth and a sixth gas chambers respectively located in the rear sides of the third and the fourth gas chambers and in the outer side surface of the storage chamber.

Also, it is characterized in that the first to fourth gas chambers are communicating with the front gas holes respectively, and the fifth and sixth gas chambers are communicating with the rear gas holes respectively.

Also, it is characterized in that a lower plate installed in the bottom surface of the storage chamber is included so that the gas holes are not exposed to the storage chamber.

Also, it is characterized in that a pathway is formed inside the lower plate for connecting the gas hole and the communicating hole.

Also, it is characterized in that a reverse flow protection means for preventing the reverse flow of the gas is formed between the gas hole and the gas chamber.

Also, it is characterized in that it further includes: a first lower plate constituting the bottom surfaces of the storage chamber and the gas chamber; a second lower plate located in the lower side of the first lower plate; and a third lower plate located in the lower side of the second lower plate, wherein a communicating hole is formed in the storage chamber of the first lower plate, and the gas hole is formed in the third lower plate, and a pathway is formed for connecting the gas hole and the communicating hole.

Also, it is characterized in that the storage chamber and the gas chamber are formed to be independent spaces from each other in the side surface of the storage chamber with a separation wall interposed therebetween, and a plurality of holes wherein gas is communicating is formed in the form of a matrix in the separation wall.

Also, it is characterized in that the storage chamber and the gas chamber are formed to be independent spaces from each other in the side surface of the storage chamber with a separation wall interposed therebetween, and a plurality of holes wherein gas is communicating is formed in the zigzag form.

Also, it is characterized in that the storage chamber and the gas chamber are formed to be independent spaces from each other in the side surface of the storage chamber with a separation wall interposed therebetween, and the separation wall is formed to be a curved shape having a curvature.

Also, it is characterized in that the gas is being filled inside the storage chamber by using the separation wall located in the side surface of the storage chamber and formed with a plurality of holes, and an outer wall spaced apart from the separation wall and having a curvature same as the separation wall.

Also, it is characterized in that a plurality of supporting bars installed in the storage chamber and supporting the wafers are included.

Also, it is characterized in that the gas chamber comprises a plurality of gas chambers and reinforcing columns are installed between the gas chambers.

According to a wafer storage container of the present invention as described above there are effects as follows.

Supplying or exhausting the gas towards the outer side surface of the wafer storage chamber through the gas holes and the gas chambers becomes possible while obtaining sufficient space for storing wafers in the storage chamber.

The gas is supplied to the entire side surfaces of the storage chamber through the area so that the gas is uniformly supplied, thereby preventing the occurrence of a dead zone wherein the fumes of the wafer cannot removed.

The gas being supplied to the storage chamber has a high pressure and fast flow rate so that it has an effect as if the gas is spraying from a nozzle which is not like the gas simply leaking through the plurality of holes, therefore the gas can be uniformly supplied up to the central region of the wafer, thereby removing the fumes remaining on the surface of the wafer efficiently.

A plurality of holes is disposed, in a matrix form having a plurality of rows and columns, between the neighboring supporting bars so that the fumes of the wafers supported by the supporting bars can be removed efficiently.

By forming the plurality of holes in a zigzag form, the gas can be supplied to the storage chamber more densely; therefore the dead zone wherein the fumes of the wafer cannot be removed can be prevented.

The gas and fumes can be efficiently exhausted through the area across the entire side surfaces of the storage chamber, and due to this, oxidation of the wafer can be prevented by replacing the storage chamber with clean gas.

By installing the separation wall removably from the wafer storage container, the separation wall can be easily replaced or cleaned, and due to this, the lifetime of the wafer storage container can be extended further.

DETAILED DESCRIPTION OF EMBODIMENT

Figure 1:
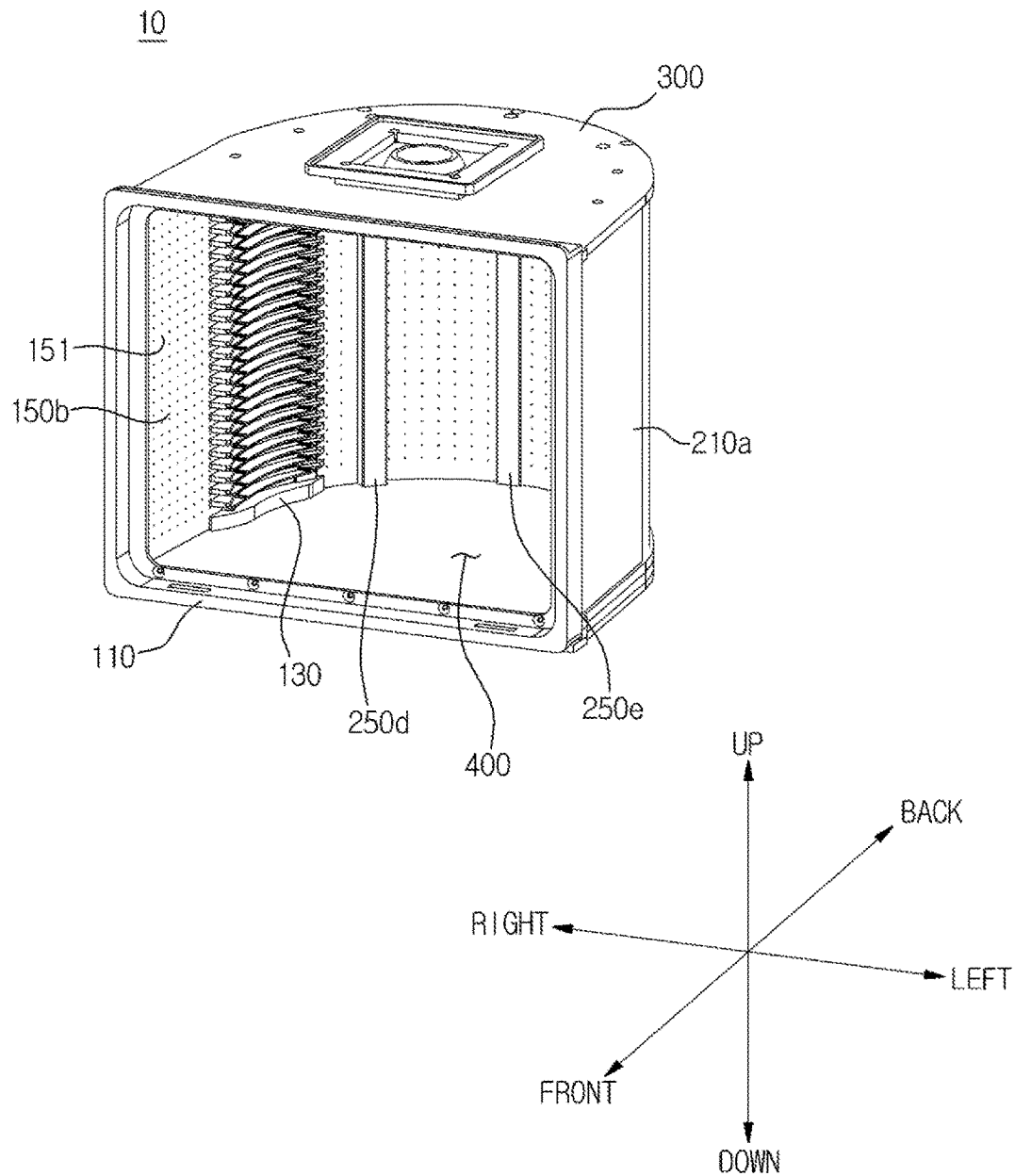
FIG. 1 is a perspective view of a wafer storage container according to a preferred exemplary embodiment of the present invention.

As used herein the singular includes the plural unless otherwise specified in the text.

The term 'gas' mentioned hereinafter collectively refers to an inert gas for removing the fumes remaining on a wafer, more particularly, it could be a nitrogen ($N_2$) gas which is one of the inert gases.

A wafer storage container according to a preferred exemplary embodiment of the present invention comprises: a storage chamber wherein wafers are stored; a gas hole located at the lower inside of the storage chamber; a gas chamber located at the outer side surface of the storage chamber, communicating with the storage chamber; and a lower plate installed in the bottom surface of the storage chamber.

The storage chamber has an opening whose front side is open, and inside thereof, the wafers moving in and out through the opening are being stored.

The gas chamber is communicating at the outer side surface of the storage chamber, and a gas hole communicating with the gas chamber is located at the lower inside the storage chamber. Therefore, the supplying and exhausting of the gas from the outer side surface of the storage chamber through the gas hole and the gas chamber becomes possible while the space for storing the wafers inside the storage chamber is sufficiently obtained.

The gas chamber communicates with the storage chamber and located at the outer side surface of the storage chamber, and plays the role of a gas supply chamber for filling and supplying the gas introduced through the gas hole to the storage chamber, or plays the role of a gas exhausting hole for exhausting the gas inside the storage chamber and the fumes of the wafer to the gas chamber.

The gas chamber may comprise a plurality of gas chambers; at least one of the plurality of gas chambers plays the role of a gas supplying chamber for supplying gas to the storage chamber; and at least one of the plurality of gas chambers plays the role of a gas exhausting chamber for exhausting the gas inside the storage chamber and the fumes of the wafer.

The gas hole is communicating with the gas chamber and located lower inside the storage chamber, and plays the role of a gas supplying hole for introducing gas and supplying the gas to the gas chamber, or a gas exhausting hole for exhausting the gas inside the storage chamber being flowed in from the gas chamber and the fumes of the wafer.

The gas hole may comprise a plurality of gas holes; at least one of the plurality of gas holes plays the role of a gas supplying hole for supplying gas to the gas chamber; and at least one of the plurality of gas chambers plays the role of a gas exhausting hole for exhausting the gas inside the storage that had been introduced from the gas chamber, and the fumes of the wafer.

Preferably, the plurality of gas holes may comprise: a pair of front gas holes located at the front side with respect to the center point of the wafer being stored inside the storage chamber; and a pair of rear gas holes located at the rear side with respect to the center point of the wafer being stored inside the storage chamber.

In addition, when both of the gas chamber and the gas hole are plurally configured, at least 2 each of the plurality of gas chambers can be communicated with one of the plurality of gas holes. Therefore, the number of the plurality of gas chambers may be larger than the number of the plurality of gas holes, and due to this, the gas chambers can be easily located in the outer side surface region of the storage chamber which is relatively remotely located from the plurality of gas holes. Since the gas chambers can be easily located outer side surface of the entire region except the front opening of the storage chamber, supplying the gas to the storage chamber or exhausting the gas inside the storage chamber and the fumes of the wafer can be more facilitated.

The lower plate is installed at the bottom surface of the storage chamber, thereby constituting the bottom surface of the storage chamber.

Inside the lower plate, a pathway communicating between the gas hole and the gas chamber may be formed.

Due to the lower plate, the gas hole can be located at the lower inside of the storage chamber without being exposed to the storage chamber, and The lower plate can be configured to form the bottom surface of the storage and the gas chamber as well, and it may be formed by integrating a plurality of lower plates.

When the lower plate is formed by integrating a plurality of lower plates, the one that forms the bottom surface of the storage chamber and/or the gas chamber is the lower plate located at the uppermost end among the plurality of the lower plates. Therefore, the gas holes are not being exposed to the storage chamber due to the lower plate located at the uppermost end among the plurality of the lower plates.

When the lower plate is formed by integrating a plurality of lower plates, a pathway for communicating between the gas hole and the gas chamber can be easily formed. Also, a pathway can be formed in a variety of forms depending on the numbers of gas holes and the gas chambers by replacing at least any one lower plate among the plurality of the lower plates.

The above described plurality of gas chambers may comprise a first to sixth gas chambers, that is, six gas chambers; and the plurality of gas holes may comprise a first to fourth gas holes, that is, four gas holes. Also, the lower plate may be formed by integrating a first to third lower plates, that is, three lower plates.

The first and second gas holes are front gas holes located at the front side with respect to the center point of the wafer being stored in the storage chamber, and the third and fourth gas holes are the rear gas holes located at the rear side with respect to the center point of the wafer being stored in the storage chamber.

The first gas hole may be communicated with the first and third gas chambers; the second gas hole may be communicated with the second and fourth gas chambers; and the third and fourth gas holes may be communicated respectively with the fifth and sixth gas chambers.

Gas supplying nozzles of the load port are coupled to the first and second gas holes so that the gas can be supplied to inside the storage chamber through the first to fourth gas chambers, and the gas exhausting nozzles of the load port are coupled to the third and fourth gas holes so that the gas of the storage chamber and the fumes of the wafer can be exhausted through the fifth and sixth gas chambers.

Hereinafter, as an exemplary embodiment of a wafer storage container according to a preferred exemplary embodiment of the present invention, as described above, it will be described with reference to the one wherein: the gas chamber comprises a first to sixth gas chambers; the gas hole comprises a first to fourth gas holes; and the lower plate comprises a first to third lower plates.

In this case, the first and second gas holes plays the role of gas supplying hole to be coupled to the gas supplying nozzles of the load port, and the third and fourth gas holes plays the role of gas exhausting holes to be coupled to the gas exhausting nozzles of the load port. Thus, the first and third gas chambers being communicated with the first gas hole, and the second and fourth gas chambers being communicated with the second gas hole play the role of a gas supplying chamber; and of course, the fifth gas chamber being communicated with the third gas hole, and the sixth gas chamber being communicated with the fourth gas hole play the role of a gas exhausting chamber.

Hereinafter, a preferred exemplary embodiment of the present invention will be described with reference to the accompanying drawings as follows.

Figure 2:
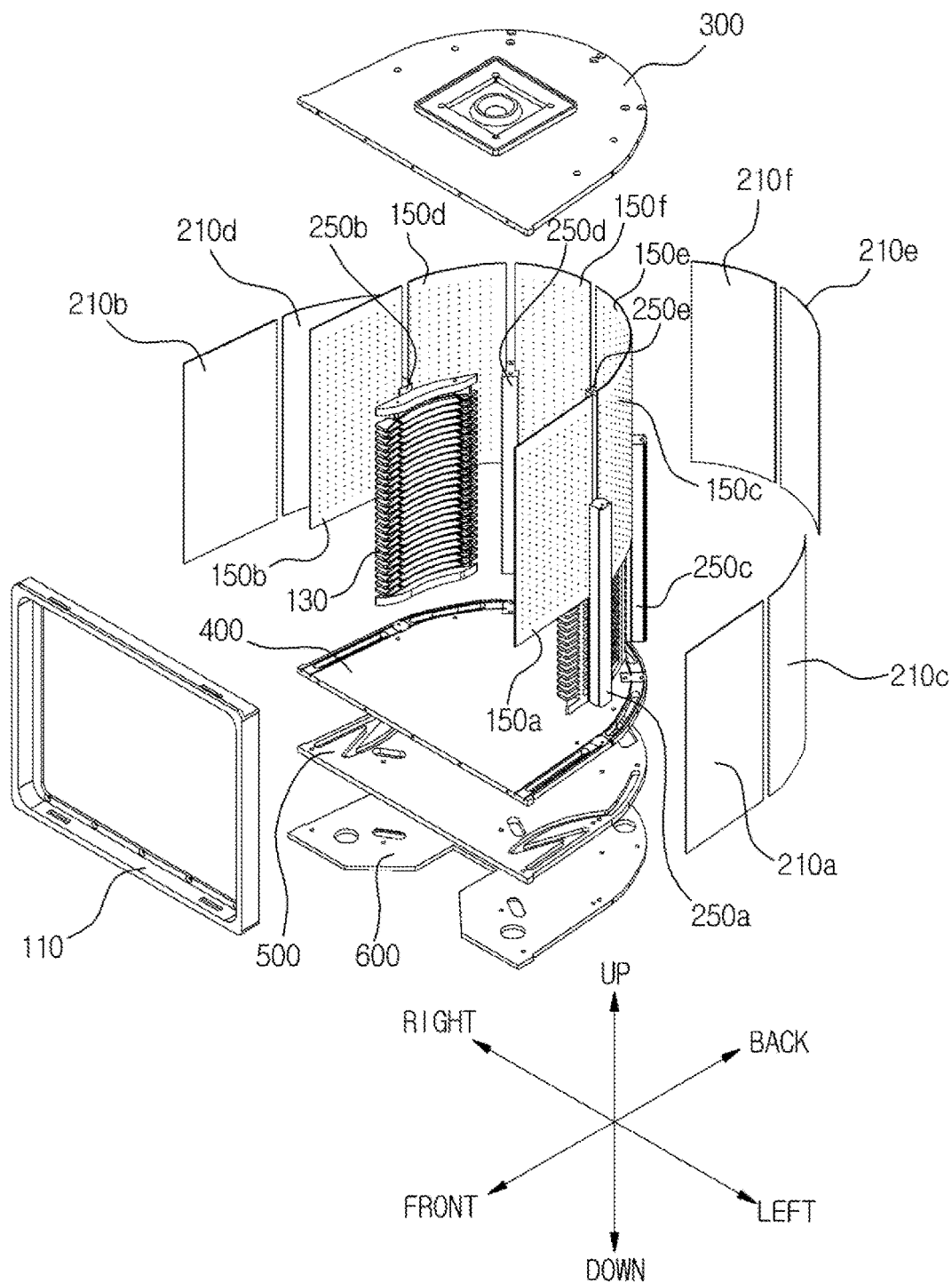
FIG. 2 is an exploded perspective view of FIG. 1.
Figure 3:
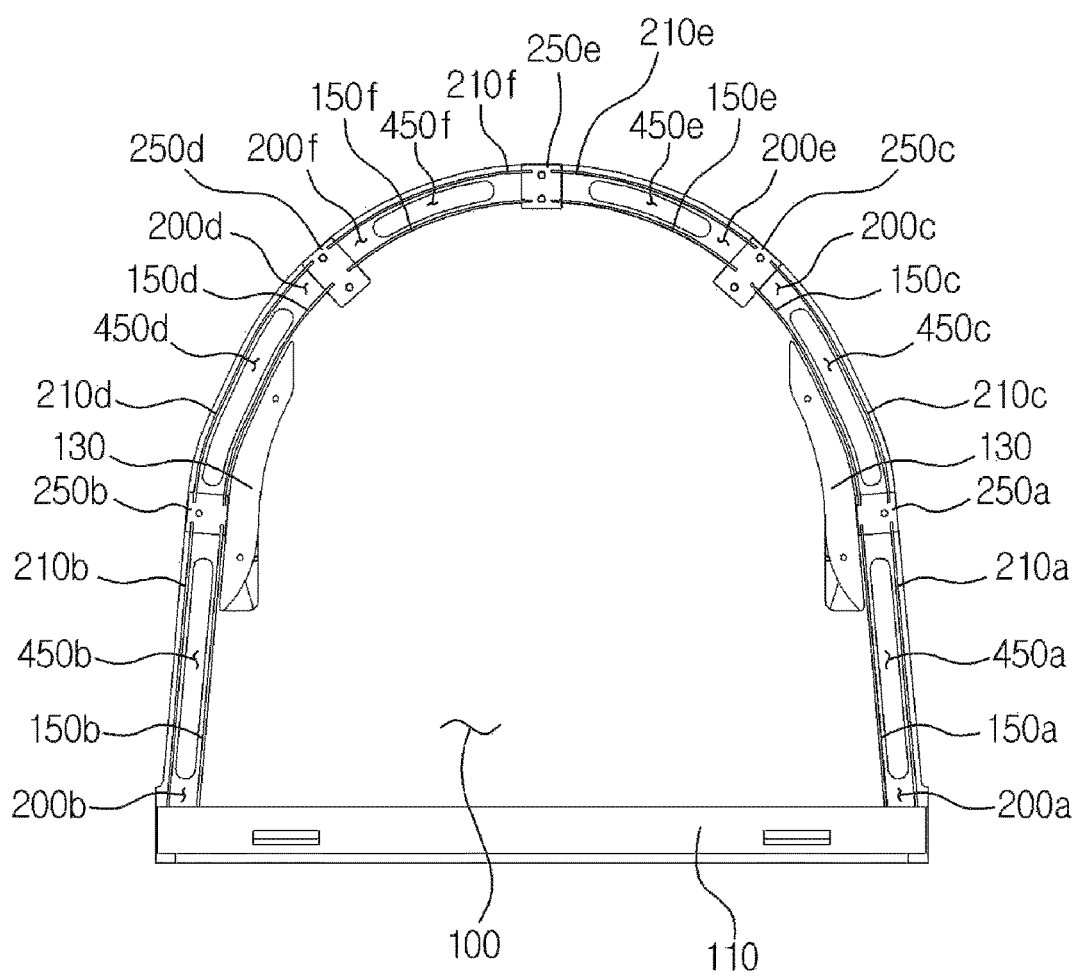
FIG. 3 is a plan cross-sectional view of FIG. 1.
Figure 4:
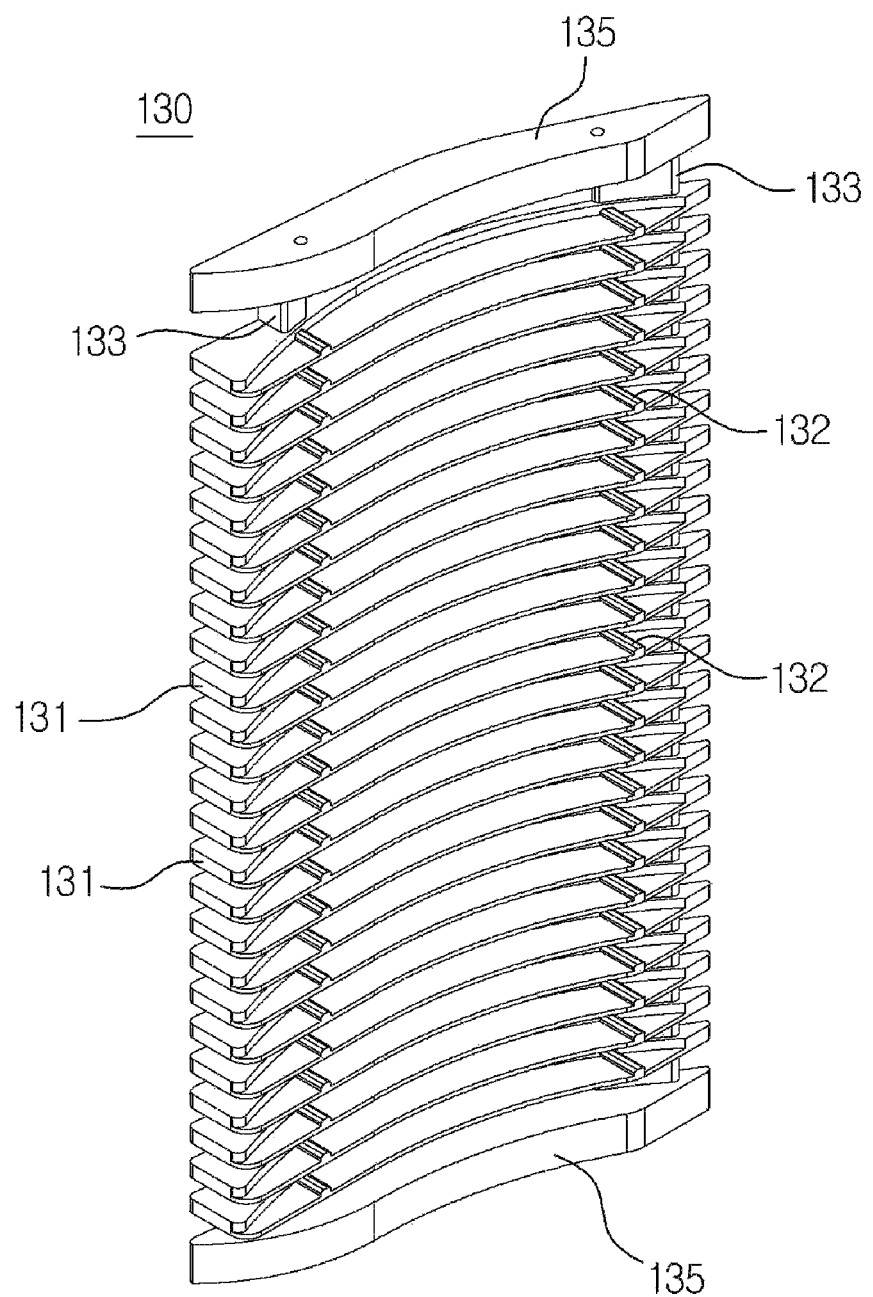
FIG. 4 is a perspective view illustrating the supporting unit of FIG. 1.
Figure 5:
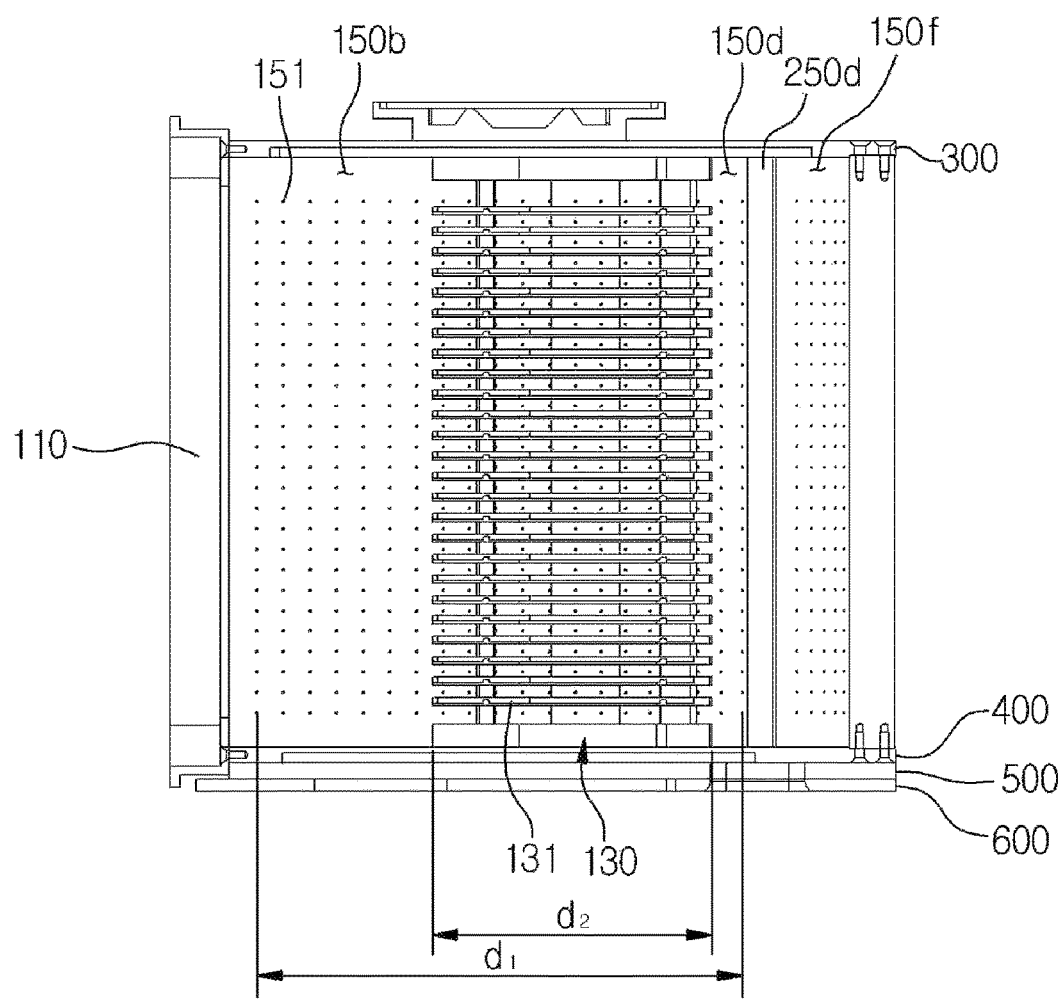
FIG. 5 is a side cross-sectional view illustrating the cross-section of the left side surface of FIG. 1.
Figure 6A:
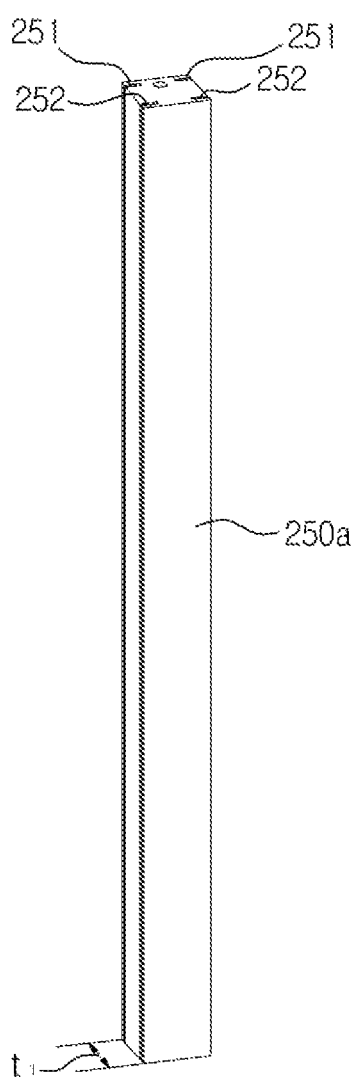
FIG. 6(a) is a perspective view illustrating the first and second reinforcing columns of FIG. 1.
Figure 6B:
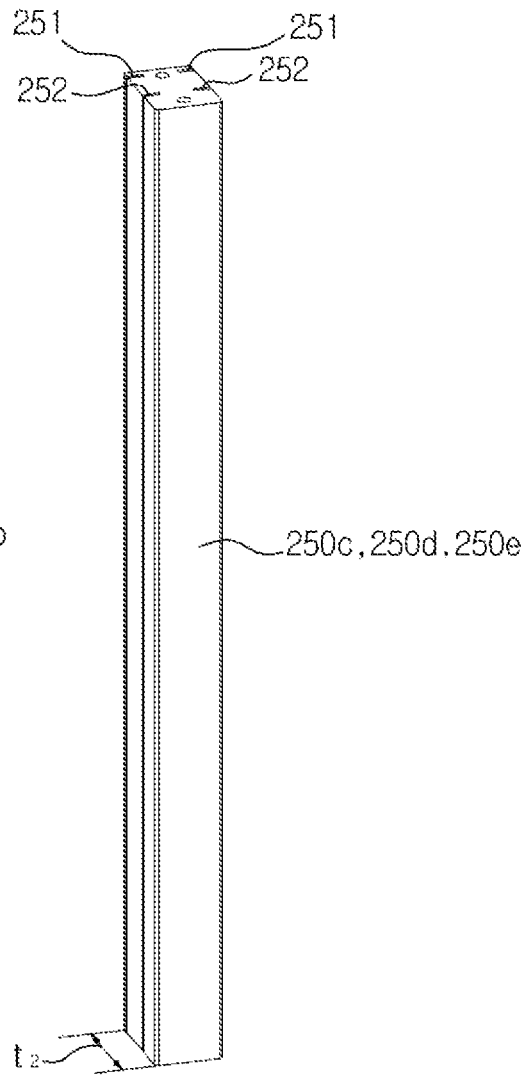
FIG. 6(b) is a perspective view illustrating the third to fifth reinforcing columns of FIG. 1.
Figure 7:
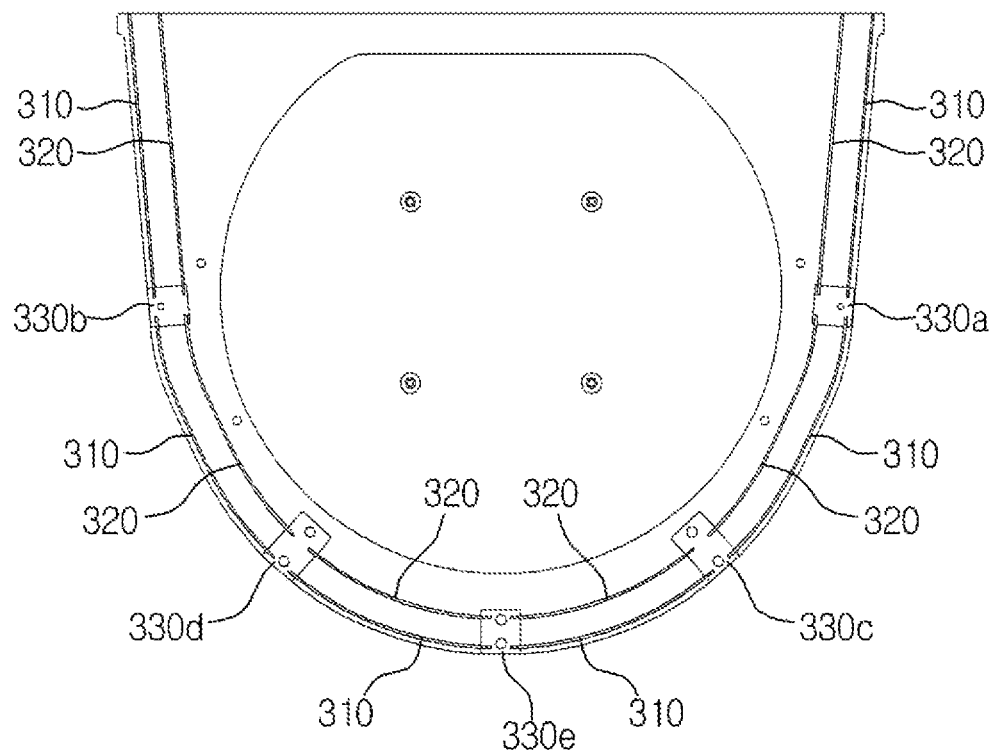
FIG. 7 is a bottom view illustrating the bottom surface of the upper plate.
Figure 8:
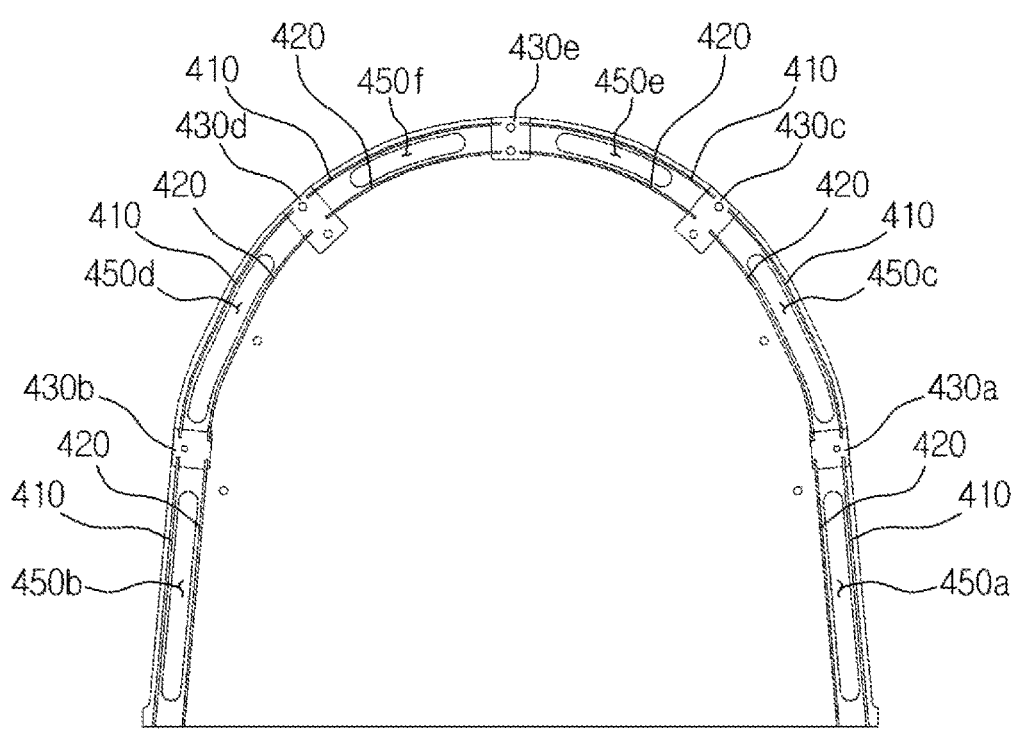
FIG. 8 is a plan view illustrating the upper surface of the first lower plate of FIG. 1.
Figure 9:
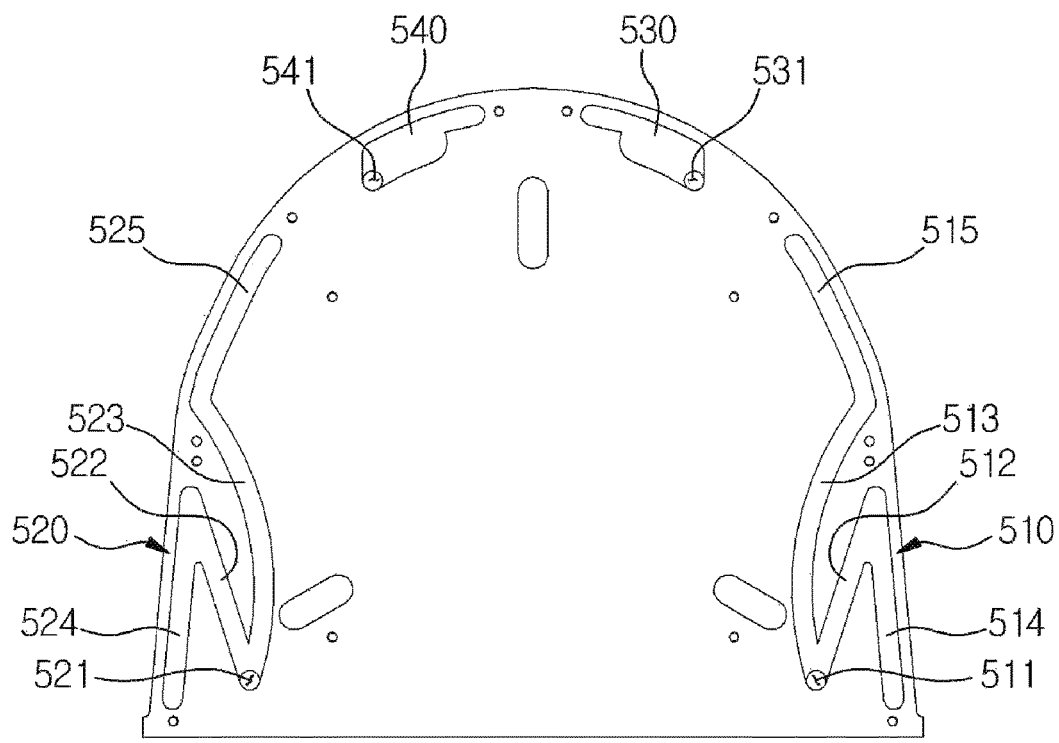
FIG. 9 is a plan view illustrating the upper surface of the second lower plate of FIG. 1.
Figure 10:
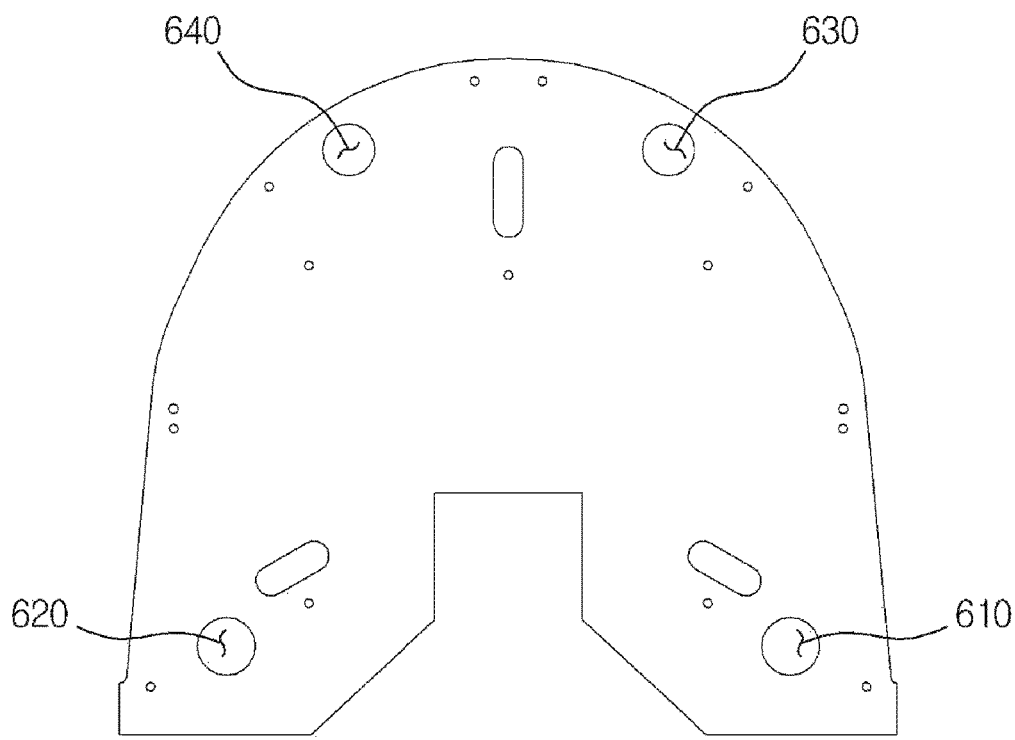
FIG. 10 is a plan view illustrating the upper surface of the third lower plate of FIG. 1.

FIG. 1 is a perspective view of a wafer storage container according to a preferred exemplary embodiment of the present invention; FIG. 2 is an exploded perspective view of FIG. 1; FIG. 3 is a plan cross-sectional view of FIG. 1; FIG. 4 is a perspective view illustrating the supporting unit of FIG. 1; FIG. 5 is a side cross-sectional view illustrating the cross-section of the left side surface of FIG. 1; FIG. 6(a) is a perspective view illustrating the first and second reinforcing columns of FIG. 1; FIG. 6(b) is a perspective view illustrating the third to fifth reinforcing columns of FIG. 1; FIG. 7 is a bottom view illustrating the bottom surface of the upper plate; FIG. 8 is a plan view illustrating the upper surface of the first lower plate of FIG. 1; FIG. 9 is a plan view illustrating the upper surface of the second lower plate of FIG. 1; FIG. 10 is a plan view illustrating the upper surface of the third lower plate of FIG. 1; and FIG. 11 is a view illustrating the gas flow of the wafer storage container according to a preferred exemplary embodiment of the present invention.

A wafer storage container 10 having the above described configuration and according to a preferred exemplary embodiment of the present invention, as illustrated in FIGS. 1 to 3 and 11, comprises: a storage chamber 100 wherein a wafer W is stored; a first to sixth gas chambers 200a to 200f located at the outer side surface of the storage chamber 100, individually communicating with the storage chamber 100; a first to fifth reinforcing columns 250a to 250e respectively installed between the first to sixth gas chambers 200a to 200f; a first to sixth separating walls 150a to 150f respectively located between the storage chamber 100 and the first to sixth gas chambers 200a to 200f; an upper plate 300 constituting the upper surface of the storage chamber 100 and the first to sixth gas chambers 200a to 200f; a first lower plate 400 constituting the bottom surface of the storage chamber 100 and the first to sixth gas chambers 200a to 200f; a second lower plate 500 located below the first lower plate 400; and a third lower plate 600 located below the second lower plate 500.

Hereinafter, the storage chamber 100 will be described.

Figure 11:
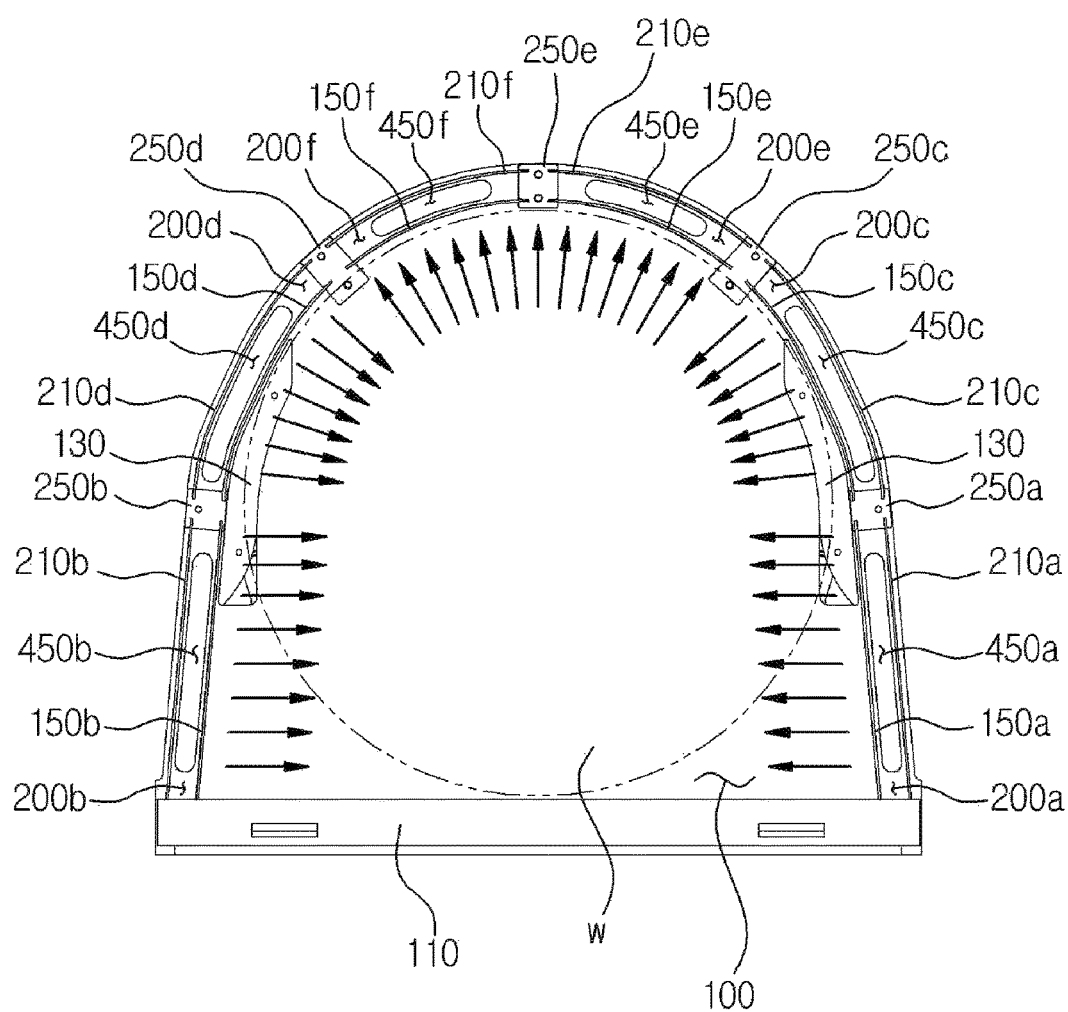
FIG. 11 is a view illustrating the gas flow of the wafer storage container according to a preferred exemplary embodiment of the present invention.

As illustrated in FIGS. 3 and 11, the storage chamber 100 represents the space inwardly formed from the first to sixth separating walls 150a to 150f, and has a front opening whose front side is open. The outer surface, upper surface, and the lower surface are respectively formed by the first to sixth separating walls 150a to 150f, the upper plate 300, and the first lower plate 400.

The first and second separating walls 150a and 150b are forming the front left and right outer surfaces of the storage chamber 100. The third and fourth separating walls 150c and 150d are forming the rear left and right outer surfaces of the storage chamber 100. The fifth and sixth separating walls 150e and 150f are forming the rear surface of the storage chamber 100. The upper plate 300 is forming the upper surface of the storage chamber 100. The first lower plate 400 is forming the bottom surface of the storage chamber 100.

The first to sixth gas chambers 200a to 200f are located at the front left and right outer surfaces, the rear left and right outer surfaces, and the rear surface except the front opening of the storage chamber 100, and due to this, the side surfaces of the storage chamber 100 are surrounded by the first to sixth gas chambers 200a to 200f except the front opening thereof.

A first to fourth gas holes, 610, 620, 630, and 640, are formed in the lower inside of the storage chamber 100. The first to fourth gas holes, 610, 620, 630, and 640, are formed in the third lower plate 600 in a way that their positions are corresponding to the region within the storage chamber 100.

The first to fourth gas holes, 610, 620, 630, and 640, are formed in the third lower plate 600 which is located at the lowest end among the first to third lower plates, 400, 500, and 600, therefore, owing to the first lower plate 400 constituting the bottom surface of the storage chamber 100, the first to fourth gas holes, 610, 620, 630, and 640, are not exposed towards the inside of the storage chamber 100.

The storage chamber 100 is formed in a way that the width of its cross-section is getting larger as it travels towards the front opening, and a pair of supporting units 130 for supporting the wafer W is installed inside and at both sides of the storage chamber 100.

Hereinafter, the supporting units 130 installed inside the storage chamber 100 will be described.

As illustrated in FIG. 4, each of the supporting plates 130 is coupled to the upper plate 300 and the first lower plate 400 for supporting the wafer W inside and at both sides of the storage chamber 100 and comprises: a plurality of supporting bars 131 plurally arranged along the up-down direction; a plurality of connecting members 133 connecting the supporting bars 131; and an intermediate member 135 formed in the connecting members 133.

The numbers of the supporting bars 131 arranged along the up-down direction may vary with the numbers of the wafers W stored inside the storage chamber 100, and preferably, should be in the range of 25 to 30.

One side of the supporting bar 131 is formed to be a curved shape having same curvature of the wafer W, and a plurality of ribs 132 can be formed in the one side thereof.

The upper surface of the rib 132 is in contact with the lower surface of a wafer W so as to support the wafer thereby, and owing to this configuration, the contact area between the wafer W and the supporting bar 131 becomes small, so that damages to the wafer W can be prevented. In addition, since one side of the supporting bar 131 is formed to be a curved shape having same curvature of the wafer W, the supporting of the wafer W becomes more facilitated.

The connecting member 133 plays the role of connecting the supporting bars 131 plurally arranged along the up-down direction to each other, and may be plurally provided.

The intermediate members 135 are respectively formed in the upper and lower sides of the connecting member 133, and the intermediate members 135 are screw-coupled with the upper plate 300 and the first lower plate 400 respectively so that the supporting unit 130 can be coupled to the upper plate 300 and the first lower plate 400.

When a pair of supporting unit 130 having the above described structure is coupled between the upper plate 300 and the first lower plate 400, and located at both side surfaces of the storage chamber 100, as illustrated in FIG. 5, it is preferred that a plurality of holes 151 of the second and fourth separating walls 150b and 150d is positioned between the supporting bars 131 plurally arranged along the up-down direction of the supporting unit 130.

Also, it is preferred that the length d1 of the region wherein a plurality of holes 151 is formed in the second and fourth separating walls 150b and 150d is formed to be longer than the length d2 of the supporting bar 131 of the supporting unit 130.

Of course, for the case of the supporting unit 130 located in the first and third separating walls 150a and 150c facing the second and fourth separating walls 150b and 150d, it is preferred that the a plurality of holes 151 of the first and third separating walls 150a and 150c is positioned between the supporting bars 131 plurally arranged along the up-down direction.

Also, it is preferred that the length of the region wherein a plurality of holes 151 is formed in the first and third separating walls 150a and 150c is formed to be longer than the length of the supporting bar 131 of the supporting unit 130.

Due to the above mentioned structure, gases can be easily supplied between the supporting bars 131, plurally arranged along the up-down direction, via the plurality of holes 151 of the first to fourth separating walls 150a to 150d. Therefore, dead zone wherein the fumes remaining on the surface of the wafer W supported by the supporting bars 131 cannot be removed will not be occurring so that the fumes can be removed easily.

The previously described supporting unit 130 can be assembled with the separately manufactured supporting bars 131, connecting members 133, and intermediate members 135, or can be integrally formed through such as a plastic injection molding process.

Unlike the aforementioned structure of the supporting unit 130, wafer W can be supported by forming the supporting bars 131 separately in the third separating wall 150c and the fourth separating wall 150d respectively.

The supporting bars 131 are plurally arranged in the third separating wall 150c and the fourth separating wall 150d along the up-down direction, and it is preferred that the plurality of holes 151 of the third and fourth separating walls 150c and 150d is positioned between the supporting bars 131 plurally arranged along the up-down direction.

Also, it is preferred that the length of the region wherein a plurality of holes 151 is formed in the third and fourth separating walls 150c and 150d is formed to be longer than the length of the supporting bar 131.

The supporting bars 131 formed respectively in the third and fourth separating walls 150c and 150d can be formed integrally with the third and fourth separating walls 150c and 150d respectively using such as a plastic injection molding process, or the supporting bars 131 can be installed separately in each of the third and fourth separating walls 150c and 150d.

As described above, since the supporting bars 131 are formed respectively in the third and fourth separating walls 150c and 150d, the supporting bars 131 formed in the third and fourth separating walls 150c and 150d can be separated together, owing to the separating structure which will be described later, when the third and fourth separating walls 150c and 150d are being separated. Thus, since the third and fourth separating walls 150c and 150d are separated from each other the supporting bars 131 that can be corroded or contaminated by the gas and the fumes of the wafer W can be easily separated, and due to this configuration, cleaning and replacement of the supporting bars 131 can be easily accomplished, thereby extending the lifetime of the wafer storage container 10 easily.

Hereinafter, the first to sixth gas chambers 200a to 200f will be described.

As illustrated in FIGS. 1 to 3, and 11, the first to sixth gas chambers 200a to 200f represent space regions respectively formed between a first to sixth outer walls 210a to 210f and the first to sixth separating walls 150a to 150f.

The outer surfaces of the first to sixth gas chambers 200a to 200f are formed by a first to sixth outer walls 210a to 210f, and the inner surfaces of the first to sixth gas chambers 200a to 200f are formed by a first to sixth separating walls 150a and 150f.

The first to sixth outer walls 210a to 210f and the first to sixth separating walls 150a and 150f constituting the outer and inner surfaces of the first to sixth gas chambers 200a to 200f may be formed to be a curved shape with same curvature, and due to this configuration, the first to sixth gas chambers 200a to 200f may have an arc-like shape in overall with a curvature.

It is preferred that each of the separation distances between the first to sixth outer walls 210a to 210f and the first to sixth separating walls 150a and 150f is to be same, and due to this configuration, the cross-sectional widths of the first to sixth gas chambers 200a to 200f are formed to be constant.

The first to sixth gas chambers 200a to 200f are located in the outer area of the storage chamber 100 with respect to the center of the storage chamber 100 so as to have a shape surrounding the storage chamber 100.

The first and second gas chambers 200a and 200b are respectively located in the front left and the front right outer surfaces with respect to the center point of the wafer W stored in the storage chamber 100.

The third and fourth gas chambers 200c and 200d are respectively located in the rear left and the rear right outer surfaces with respect to the center point of the wafer W stored in the storage chamber 100. The fifth and sixth gas chambers 200e and 200f are respectively located in the rear outer surfaces respectively located in the rear of the third and fourth gas chambers 200c and 200d.

The first gas chamber 200a, the third gas chamber 200c, the fifth gas chamber 200e, the sixth gas chamber 200f, the fourth gas chamber 200d, and the second gas chamber 200b are located along the circumference of the storage chamber 100 from the left front to the right front with respect to the storage chamber 100.

The first gas chamber 200a and the second gas chamber 200b are facing each other, and the third gas chamber 200c and the fifth gas chamber 200e are facing each other.

A cover 110 is installed in front of the first gas chamber 200a and the second gas chamber 200b.

The cover 110 constitutes the front surface of the first gas chamber 200a and the third gas chamber 200c, and at the same time, plays the role of reinforcing the front section of the wafer storage container 10 by connecting the upper plate 300 and the first to third lower plates 400, 500, and 600.

The upper surface and the bottom surface of the first gas chamber 200a are formed by the upper plate 300 and the first lower plate 400 respectively. The left and right surfaces of the first gas chamber 200a are formed by the first outer wall 210a and the first separating wall 150a respectively. The front and rear surfaces of the first gas chamber 200a are formed by the cover 110 and the first reinforcing column 250a respectively. A first communicating hole 450a is formed in the bottom surface of the first gas chamber 200a, that is, in the first lower plate 400 constituting the bottom surface of the region of the first gas chamber 200a.

The upper surface and the bottom surface of the second gas chamber 200b are formed by the upper plate 300 and the first lower plate 400 respectively. The left and right surfaces of the second gas chamber 200b are formed by the second outer wall 210b and the second separating wall 150b respectively. The front and rear surfaces of the second gas chamber 200b are formed by the cover 110 and the second reinforcing column 250b respectively. A second communicating hole 450b is formed in the bottom surface of the second gas chamber 200b, that is, in the first lower plate 400 constituting the bottom surface of the region of the second gas chamber 200b.

The upper surface and the bottom surface of the third gas chamber 200c are formed by the upper plate 300 and the first lower plate 400 respectively. The left and right surfaces of the third gas chamber 200c are formed by the third outer wall 210c and the third separating wall 150c respectively. The front and rear surfaces of the third gas chamber 200c are formed by the first reinforcing column 250a and the third reinforcing column 250c respectively. A third communicating hole 450c is formed in the bottom surface of the third gas chamber 200c, that is, in the first lower plate 400 constituting the bottom surface of the region of the third gas chamber 200c.

The upper surface and the bottom surface of the fourth gas chamber 200d are formed by the upper plate 300 and the first lower plate 400 respectively. The left and right surfaces of the fourth gas chamber 200d are formed by the fourth outer wall 210d and the fourth separating wall 150d respectively.

The front and rear surfaces of the fourth gas chamber 200d are formed by the second reinforcing column 250b and the fourth reinforcing column 250d respectively. A fourth communicating hole 450d is formed in the bottom surface of the fourth gas chamber 200d, that is, in the first lower plate 400 constituting the bottom surface of the region of the fourth gas chamber 200d.

The upper surface and the bottom surface of the fifth gas chamber 200e are formed by the upper plate 300 and the first lower plate 400 respectively. The left and right surfaces of the fifth gas chamber 200e are formed by the fifth outer wall 210e and the fifth separating wall 150e respectively. The front and rear surfaces of the fifth gas chamber 200e are formed by the third reinforcing column 250c and the fifth reinforcing column 250e respectively. A fifth communicating hole 450e is formed in the bottom surface of the fifth gas chamber 200e, that is, in the first lower plate 400 constituting the bottom surface of the region of the fifth gas chamber 200e.

The upper surface and the bottom surface of the sixth gas chamber 200f are formed by the upper plate 300 and the first lower plate 400 respectively. The left and right surfaces of the sixth gas chamber 200f are formed by the sixth outer wall 210f and the sixth separating wall 150f respectively. The front and rear surfaces of the sixth gas chamber 200f are formed by the fourth reinforcing column 250d and the fifth reinforcing column 250e respectively. A sixth communicating hole 450f is formed in the bottom surface of the sixth gas chamber 200f, that is, in the first lower plate 400 constituting the bottom surface of the region of the sixth gas chamber 200f.

The numbers of the first to sixth gas chambers 200a to 200f may vary depending of the usage and the size of the wafer storage container 10. Accordingly, the numbers of the first to sixth gas chambers 200a to 200f, the first to sixth separating walls 150a and 150f, the first to sixth communicating holes 450a to 450f, and the first to fifth reinforcing columns 250a to 250e may also be varied.

Hereinafter, the first to fifth reinforcing columns 250a to 250e will be described.

As illustrated in FIGS. 1 to 3, 6a, and 6b, the first reinforcing column 250a connects the first outer wall 210a and the first separating wall 150a; connects the third outer wall 210c and the third separating wall 150c; and installed between the first gas chamber 200a and the third gas chamber 200c.

The second reinforcing column 250b connects the second outer wall 210b and the second separating wall 150b; connects the fourth outer wall 210d and the fourth separating wall 150d; and installed between the second gas chamber 200b and the fourth gas chamber 200d.

The third reinforcing column 250c connects the third outer wall 210c and the third separating wall 150c; connects the fifth outer wall 210e and the fifth separating wall 150e; and installed between the third gas chamber 200c and the fifth gas chamber 200e.

The fourth reinforcing column 250d connects the fourth outer wall 210d and the fourth separating wall 150d; connects the sixth outer wall 210f and the sixth separating wall 150f; and installed between the fourth gas chamber 200d and the sixth gas chamber 200f.

The fifth reinforcing column 250e connects the fifth outer wall 210e and the fifth separating wall 150e; connects the sixth outer wall 210f and the sixth separating wall 150f; and installed between the fifth gas chamber 200e and the sixth gas chamber 200f.

The first to fifth reinforcing columns 250a to 250e are installed between the first to sixth gas chambers 200a to 200f respectively so that they not only play the role of dividing the first to sixth gas chambers 200a to 200f into separate and independent spaces, but also play the role of further reinforcing the wafer storage container 10 by connecting the upper plate 300 and the lower plate 400 and supporting them.

The upper ends of the first to fifth reinforcing columns 250a to 250e are respectively fixed to a first to sixth reinforcing column upper part fixing grooves 330a to 330e in the upper plate 300, and screw-coupled thereto.

The lower ends of the first to fifth reinforcing columns 250a to 250e are respectively fixed to a first to sixth reinforcing column lower part fixing grooves 430a to 430e in the lower plate 400, and screw-coupled thereto.

In both sides of the first to fifth reinforcing columns 250a to 250e, outer wall coupling grooves 251 and separating wall coupling grooves 252 are formed respectively. Inside the outer wall coupling grooves 251, the first to sixth outer walls 210a to 210f are inserted respectively; and inside the separating wall coupling grooves 252, the first to sixth separating walls 150a to 150f are inserted respectively.

The shape of the first and second reinforcing columns 250a and 250b is same as illustrated in FIG. 6(a), and the shape of the third to fifth reinforcing columns 250c and 250e is same as illustrated in FIG. 6(b).

In addition, it is preferred that the thickness $t_1$ of the first and second reinforcing columns 250a and 250b is thinner than the thickness t2 of the third to fifth reinforcing columns 251c to 251e, and this is for facilitating the installation of the supporting unit 130 being installed close to the first and second reinforcing columns 250a and 250b.

Due to the coupling structures of the first to fifth reinforcing columns 250a to 250e, the upper plate 300, the first lower plate 400, the first to sixth outer walls 210a to 210f, and the first to sixth separating walls 150a to 150f, which have been previously described, the first to sixth outer walls 210a to 210f and the first to sixth separating walls 150a to 150f can be easily separated from the wafer storage container 10.

For example, after separating the upper plate 300 or the first lower plate 400, which is screw-coupled to the first to fifth reinforcing columns 250a to 250e, from the first to fifth reinforcing columns 250a to 250e; the first to sixth outer walls 210a to 210f respectively inserted into the outer wall coupling grooves 251 of the first to fifth reinforcing columns 250a to 250e can be pulled out and separated; or the first to sixth separating walls 150a to 150f respectively inserted into the separation wall coupling grooves 252 of the first to fifth reinforcing columns 250a to 250e can be pulled out and separated.

In this way, when the first to sixth outer walls 210a to 210f and the first to sixth separating walls 150a to 150f are configured to be easily separable from the wafer storage container 10, advantageous merit can be obtained in the aspects of maintenance of the wafer storage container 10.

For example, when the wafer storage container 10 is used for a long time, the first to sixth separating walls 150a to 150f wherein the gas and the fumes of the wafer are flowing in and out relatively heavily can be corroded or contaminated by the gas and the fumes of the wafer W, in this case, the lifetime of the wafer storage container 10 can be easily extended by separating the first to sixth separating walls 150a to 150f for replacement or cleaning thereof.

Hereinafter, the first to sixth separating walls 150a to 150f will be described.

As illustrated in FIGS. 1 to 3, and 11, the first to sixth separating walls 150a to 150f are located respectively between the storage chamber 100 and the first to sixth gas chambers 200a to 200f.

The first to sixth separating walls 150a to 150f play the role of dividing the storage chamber 100 and the first to sixth gas chambers 200a to 200f into separate independent spaces, and at the same time, play the role of communicating the gas flowing inside the storage chamber 100 and the first to sixth gas chambers 200a to 200f via the holes 151 formed in the first to sixth separating walls 150a to 150f.

As illustrated in FIG. 5, a plurality of holes 151 are respectively formed in the first to sixth separating walls 150a to 150f and preferred to be formed in a matrix form having a plurality of columns and rows.

In this case, the plurality of holes 151 is disposed between the supporting bars 131, neighboring along the up-down direction, in a matrix form having a plurality of columns and rows, so that the fumes of the wafer W being supported by the supporting bars 131 can be efficiently removed.

It is preferred that the intervals between the columns and the intervals between the rows of such matrix type plurality of holes 151 are to be same. In other words, it is preferred that the vertical and horizontal distances between the holes 151 are to be same.

Also, unlike the above case, a plurality of holes 151 can be formed in a zigzag shape, which is not a matrix type, wherein neighboring columns are crossing each other while a plurality of rows and columns are contained therein.

In this case, when compared to the plurality of holes 151 in a matrix form, the region wherein the holes 151 are not formed between the plurality of columns and rows of the plurality of holes 151, that is, the distance between the holes 151, becomes further narrow, therefore the gas can be more densely supplied to the inside of the storage chamber 100.

The plurality of holes 151 can be formed in a way that the diameter thereof becomes larger as they travel towards the upper side in the first to sixth separating walls 150a to 150f.

In this case, when the gas is filled inside the first to fourth gas chambers 200a to 200d and being supplied to the storage chamber 100, the concentration of gas supply through the plurality of holes 151 located in the lower side of the first to fourth separating walls 150a to 150d can be prevented. Therefore, the gas can be uniformly supplied to the storage chamber 100 through the plurality of holes 151 formed in the upper side and the lower side of the first to fourth separating walls 150a to 150d.

Also, when the gas supplied to the storage chamber 100 and the fumes of the wafer W are exhausted through the fifth and sixth gas chambers 200e and 200f, according to the similar principle described above, the gas can be uniformly exhausted to the fifth and sixth gas chambers 200e and 200f through the plurality of holes 151 formed in the upper side and the lower side of the fifth and sixth separating walls 150e and 150f.

It is preferred that the first to sixth separating walls 150a to 150f are installed in a way that they can be separable from the wafer storage container 10, and the description on this will be omitted since it has been described previously.

Hereinafter, the upper plate 300 will be described.

As illustrated in FIGS. 1, 2 and 7, the upper plate 300 is located in a way that it faces the first lower plate 400 when viewing from above the first lower plate 400, and forms the upper surface of the storage chamber 100 and the first to sixth gas chambers 200a to 200f.

The rear portion thereof may have an arc-like shape with a curvature so as to be corresponding to the overall shape of the first to sixth gas chambers 200a to 200f.

In the lower surface of the upper plate 300, outer wall upper part fixing grooves 310, separating wall upper part fixing grooves 320, and a first to fifth reinforcing column upper part fixing grooves 330a to 330e are formed.

The first to sixth outer walls 210a to 210f are inserted into the outer wall upper part fixing grooves 310 and fixed thereto. The first to sixth separating walls 150a to 150f are inserted into the separating wall upper part fixing grooves 320 and fixed thereto.

The outer wall upper part fixing grooves 310 and the separating wall upper part fixing grooves 320 can be formed to be a curved shape having a curvature corresponding to the shape of the outer walls and the separating walls to where they are fixed respectively.

The upper parts of the first to fifth reinforcing columns 250a to 250e are inserted into the first to fifth reinforcing column upper part fixing grooves 330a to 330e, and fixed thereto. The first to fifth reinforcing columns 250a to 250e fixed to the first to fifth reinforcing column upper part fixing grooves 330a to 330e are screw-coupled to the upper plate 300 respectively. In addition, the first to fifth reinforcing column upper part fixing grooves 330a to 330e may have the shape respectively corresponding to the upper part of the first to fifth reinforcing columns 250a to 250e.

Hereinafter, the first lower plate 400 will be described.

As illustrated in FIGS. 1, 2, and 8, the first lower plate 400 is located in a way that it faces the upper plate 300 when viewing from below the upper plate 300, and forms the bottom surface of the storage chamber 100 and the first to sixth gas chambers 200a to 200f.

The rear side may have an arc-like shape with a curvature so as to be corresponding to the overall shape of the first lower plate 400 and the first to sixth gas chambers 200a to 200f.

In the upper surface of the first lower plate 400, outer wall lower part fixing grooves 410, separating wall lower part fixing grooves 420, and a first to fifth reinforcing column lower part fixing grooves 430a to 430e are formed.

The first to sixth outer walls 210a to 210f are inserted into the outer wall lower part fixing grooves 410 and fixed thereto.

The first to sixth separating walls 150a to 150f are inserted into the separating wall lower part fixing grooves 420 and fixed thereto.

The outer wall lower part fixing grooves 410 and the separating wall lower part fixing grooves 420 can be formed to be a curved shape having a curvature corresponding to the shape of the outer walls and the separating walls to where they are fixed respectively.

The lower part of the first to fifth reinforcing columns 250a to 250e are inserted into the first to fifth reinforcing column lower part fixing grooves 430a to 430e and fixed thereto. The first to fifth reinforcing columns 250a to 250e inserted into the first to fifth reinforcing column lower part fixing grooves 430a to 430e and fixed thereto are respectively screw-coupled with the lower plate 400. In addition, the first to fifth reinforcing column lower part fixing grooves 430a to 430e may have a shape corresponding to the lower parts of the first to fifth reinforcing columns 250a to 250e.

In addition, a first to sixth communicating holes 450a to 450f penetrating through the upper and lower surfaces of the first lower plate 400 are respectively formed in the lower plate 400.

In this case, the first to sixth communicating holes 450a to 450f are formed in the first lower plate 400 so as to be located respectively in the bottom surfaces of the first to sixth gas chambers 200a to 200f.

The first to fourth communicating holes 450a to 450d play the role of introducing the gas that had been supplied through the first and second gas holes 610 and 620, into the first to fourth gas chambers 200a to 200d respectively.

The fifth and sixth communicating holes 450e and 450f play the role of introducing the exhausting gas and the fumes into the third and fourth gas holes 630 and 640 when the gas flowing inside the storage chamber 100 and the fumes of the wafer W are being exhausted to the fifth and sixth gas chambers 200e and 200f.

The first to sixth communicating holes 450a to 450f may have the shape of an elongated hole respectively formed in length in one direction, or the shape of a slit having same width.

When the first to sixth communicating holes 450a to 450f have the shape of an elongated hole, the gas supply from the first to fourth gas chambers 200a to 200d to the storage chamber 100, and the exhausting of the gas and the fumes of the wafer W to the fifth and sixth gas chambers 200e and 200f become further facilitated.

If described in detail, the gas supply from the first to fourth gas chambers 200a to 200d to the storage chamber 100 is accomplished through the (a sort of) area due to the plurality of holes 151 of the first to fourth separating walls 150a to 150d. In this case, when the first to fourth communicating holes 450a to 450d that had been respectively formed in the bottom surface of the first to fourth gas chambers 200a to 200d are formed in the shape of an elongated hole, the introduction of the gas into the first to fourth gas chambers 200a to 200d can be accomplished uniformly across most area of the bottom surface of the first to fourth gas chambers 200a to 200d. Thus, uniform gas is filled along the length direction of the bottom surface of the first to fourth gas chambers 200a to 200d (this is same lengthwise direction of the first to fourth communicating holes 450a to 450d that are formed to be the shape of an elongated hole), and when the gas filled in such a way is being supplied to the storage chamber 100 through the plurality of holes 151 of the first to fourth separating walls 150a to 150d, the supplying of the gas through the area can be accomplished more effectively.

The exhausting of the gas in the storage chamber 100 and the fumes of the wafer W through the area by the plurality of holes 151 of the fifth and sixth separating walls 150e and 150f respectively located between the storage chamber 100 and the fifth and sixth gas chambers 200e and 200f, can also be accomplished by the same principle as described above. Thus, due to the fifth and sixth communicating holes 450e and 450f formed to be the shape of an elongated hole, the gas in the storage chamber 100 and the fumes of the wafer W can be effectively exhausted to the third and fourth gas holes 630 and 640 through the fifth and sixth gas chambers 200e and 200f.

Hereinafter, the second lower plate 500 will be described.

As illustrated in FIGS. 1, 2, and 9, the second lower plate 500 is located between the first lower plate 400 and the third lower plate 600, and a first to fourth pathways 510, 520, 530, and 540 are formed therein.

The rear portion of the second lower plate 500 may have an arc-like shape with a curvature so as to be corresponding to the overall shape of the first to sixth gas chambers 200a to 200f just like the first lower plate 400.

The first and third communicating holes 450a and 450c formed in the first lower plate 400 and the first gas hole 610 formed in the third lower plate 600 are communicating with each other via the first pathway 510 which comprises: a first inlet hole 511, a first and second branch pathways 512 and 513, and a first and second communicating portions 514 and 515.

The first inlet hole 511 is formed penetrating through the upper surface and lower surface of the second lower plate 500; and positioned at the front left side of the second lower plate 500 so as to be corresponding to the first gas hole 610.

The first inlet hole 511 and the first communicating portion 514 are communicating with each other via the first branch pathway 512, and the first inlet hole 511 and the second communicating portion 515 are communicating with each other via the second branch pathway 513.

In this case, for easy communication of the first and second branch pathways 512 and 513, and the first and second communicating portions 514 and 515, it is preferred that a bending portion having the shape of a curve is formed in at least any one of the first and second branch pathways 512 and 513.

The first communicating portion 514 is located in the lower region of the first gas chamber 200a so as to be corresponding to the first communicating hole 450a of the first lower plate 400, and the second communicating portion 515 is located in the lower region of the third gas chamber 200c so as to be corresponding to the third communicating hole 450c of the first lower plate 400.

In this case, it is preferred that the first communicating portion 514 is formed in the shape of an elongated hole like the first communicating hole 450a or in the shape of a slit except the area that is communicating with the first branch pathway 512, and it is also preferred that the second communicating portion 515 is formed in the shape of an elongated hole like the third communicating hole 450c or in the shape of a slit except the area that is communicating with the first branch pathway 512.

Since the first and second branch pathways 512 and 513, and the first and second communicating portions 514 and 515 play the role of (a sort of) flow path wherein the gas is being flowed, it is preferred that they are formed only in the upper surface or in the lower surface of the second lower plate 500 unlike the first inlet hole 511 penetrating the upper and lower surfaces of the second lower plate 500.

In addition, a reverse flow prevention means (not shown) for preventing the reverse flow of the gas can be formed in the first and second branch pathways 512 and 513 so as to be located between the first gas hole 610 and the first and third gas chambers 200a and 200c; and the reverse flow prevention means may be a check valve.

The second and fourth communicating holes 450b and 450d formed in the first lower plate 400 and the second gas hole 620 formed in the third lower plate 600 are communicating with each other via the second pathway 520 which comprises: a second inlet hole 521, a third and fourth branch pathways 522 and 523, and a third and fourth communicating portions 524 and 525.

The second inlet hole 521 is formed penetrating through the upper surface and lower surface of the second lower plate 500; and positioned at the front right side of the second lower plate 500 so as to be corresponding to the second gas hole 620.

The second inlet hole 521 and the third communicating portion 524 are communicating with each other via the third branch pathway 522, and the second inlet hole 521 and the fourth communicating portion 525 are communicating with each other via the fourth branch pathway 523.

In this case, for easy communication of the third and fourth branch pathways 522 and 523, and the third and fourth communicating portions 524 and 525, it is preferred that a bending portion having the shape of a curve is formed in at least any one of the third and fourth branch pathways 522 and 523.

The third communicating portion 524 is located in the lower region of the first gas chamber 200a so as to be corresponding to the second communicating hole 450b of the first lower plate 400, and the second communicating portion 515 is located in the lower region of the third gas chamber 200c so as to be corresponding to the third communicating hole 450c of the first lower plate 400.

In this case, it is preferred that the third communicating portion 524 is formed in the shape of an elongated hole like the second communicating hole 450b or in the shape of a slit except the area that is communicating with the second branch pathway 513, and it is also preferred that the fourth communicating portion 525 is formed in the shape of an elongated hole like the fourth communicating hole 450d or in the shape of a slit except the area that is communicating with the fourth branch pathway 523.

Since the third and fourth branch pathways 522 and 523, and the third and fourth communicating portions 524 and 525 play the role of (a sort of) flow path wherein the gas is being flowed, it is preferred that they are formed only in the upper surface or in the lower surface of the second lower plate 500 unlike the first and second inlet holes 511 and 521 penetrating the upper and lower surfaces of the second lower plate 500.

In addition, a reverse flow prevention means (not shown) for preventing the reverse flow of the gas can be formed in the third and fourth branch pathways 522 and 523 so as to be located between the second gas hole 620 and the second and fourth gas chambers 200b and 200d; and the reverse flow prevention means may be a check valve.

The fifth communicating hole 450e formed in the first lower plate 400 and the third gas hole 630 formed in the third lower plate 600 are communicating with each other via the third pathway 530.

A first exhausting hole 531 penetrating the upper and lower surfaces of the second lower plate 500 is formed in the third pathway 530, and the first exhausting hole 531 is located at the rear left side of the second lower plate 500 so as to be corresponding to the third gas hole 630.

In addition, for the easy flowing of the gas towards the fifth communicating hole 450e, it is preferred that a specific area in the third pathway 530 which corresponds to the fifth communicating hole 450e is formed in the shape of an elongated hole like the fifth communicating hole 450e or in the shape of a slit.

The sixth communicating hole 450f formed in the first lower plate 400 and the fourth gas hole 640 formed in the third lower plate 600 are communicating with each other via the fourth pathway 540.

A second exhausting hole 541 penetrating the upper and lower surfaces of the second lower plate 500 is formed in the fourth pathway 540, and located at rear right side of the second lower plate 500 so as to be corresponding to the fourth gas hole 640.

In addition, for the easy flowing of the gas towards the sixth communicating hole 450f, it is preferred that a specific area in the fourth pathway 540 which corresponds to the sixth communicating hole 450f is formed in the shape of an elongated hole like the sixth communicating hole 450f or in the shape of a slit.

Since the third and fourth pathways 530 and 540 play the role of (a sort of) flow path wherein the gas is being flowed, it is preferred that they are formed only in the upper surface or in the lower surface of the second lower plate 500 unlike the first and second exhausting holes 531 and 541 penetrating the upper and lower surfaces of the second lower plate 500.

It is preferred that the diameters of the previously described first and second inlet holes 511 and 521, and the diameters of the first and second exhausting holes 531 and 541, are formed to be smaller than the diameters of the first and the second gas holes 610 and 620, and the diameters of the third and fourth gas holes 630 and 640.

If described in detail, as will be described later, it is preferred that the diameters of the first and second gas holes 610 and 620 are same as the diameter of the gas supplying nozzles of the load port, and the diameters of the third and fourth gas holes 630 and 640 are same as the diameters of gas exhausting nozzles of the load port.

If described in detail, the gas supplying nozzles and the gas exhausting nozzles of the load port have relatively large diameters. Therefore, if the diameters of the first inlet holes 511 and 521 and the diameters of the first and second exhausting holes 531 and 541 are same or larger than the diameters of the first to fourth gas holes 610, 620, 630, and 640, the widths of the first to fourth pathways 510, 520, 530, and 540 must become larger that much, therefore the efficiency of supplying or exhausting of the gas may be decreased. Thus, by forming the diameters of the first and second inlet holes 511 and 521 and the first and second exhausting hole 531 and 541 to be respectively smaller than the diameters of the first and second gas holes 610 and 620 and the third and fourth gas holes 630 and 640, the flow of the gas supplied or exhausted from and to the first to fourth pathways 510, 520, 530, and 540 becomes more facilitated. In addition, as the size of the first to fourth pathways 510, 520, 530, and 540 becomes smaller, compactization of the wafer storage container 10 can be achieved.

Hereinafter, the third lower plate 600 will be described.

As illustrated in FIGS. 1, 2, and 10, the third lower plate 600 is located beneath the second lower plate 500, and forms the lowest surface of the wafer storage container 10.

The first to fourth gas holes 610, 620, 630, and 640 are formed in the third lower plate 600.

As described above, the first and second gas holes 610 and 620, coupled with the gas supplying nozzles of the load port, play the role of gas supplying holes for introducing the gas into the storage container 10. In addition, the first and second gas holes 610 and 620 are formed penetrating through the upper and lower surfaces of the third lower plate 600, and respectively located at the front left and right sides of the third lower plate 600.

The first and second gas holes 610 and 620 are located in the lower side inside the storage chamber 100, that is, further inward direction of the wafer storage container 10 than the first and second separating walls 150a and 150b.

As described above, the third and fourth gas holes 630 and 640, coupled with the gas exhausting nozzles of the load port, play the role of gas exhausting holes for exhausting the gas supplied inside the storage chamber 100 and the fumes of the wafer W towards the gas exhausting nozzles of the load port. In addition, the third and fourth gas holes 630 and 640 are formed penetrating through the upper and lower surfaces of the third lower plate 600, and respectively located at the rear left and right sides of the third lower plate 600.

The third and fourth gas holes 630 and 640 are located in the lower side inside the storage chamber 100, that is, further inward direction of the wafer storage container 10 than the fifth and sixth separating walls 150e and 150f.

It is preferred that the diameters of the first and second gas holes 610 and 620 are same as the diameters of the gas supplying nozzles of the load port, but larger than those of the first and second inlet holes 511 and 521; and the diameters of the third and fourth gas holes 630 and 640 are same as the diameters of the gas exhausting nozzles of the load port, but larger than those of the first and second exhausting holes 531 and 541.

A reverse flow prevention means (not shown) for preventing the reverse flow of the gas can be formed in the first to fourth gas holes 610, 620, 630, and 640, and the reverse flow prevention means may be a check valve.

Thus, due to the check valve the leaking of the gas remaining inside the wafer storage container 10 and the fumes of the wafer W towards the outside of the wafer storage container can be prevented when the wafer storage container 10 is separated from the load port.

The above described first to third lower plates 400, 500, and 600 are coupled along the up-down direction.

In other words, the second and third lower plates 500 and 600 are coupled to the lower side of the first lower plate 400 which is coupled to the lower ends of the first to fifth reinforcing columns 250a to 250e; and it is preferred that such second and third lower plates 500 and 600 are screw-coupled so as to be easily separated from the first lower plate 400.

As described above, by obtaining a structure wherein the first to third lower plates 400, 500, and 600 are mutually coupled, there is an advantage that gas chambers having various structures can be more easily manufactured.

For example, the numbers, the shapes, or the like of the communicating holes to be formed in the first lower plate 400 are organized in various ways; accordingly, the pathways of the second lower plate 500 are formed; and the numbers, size, and the like of the gas chambers of the wafer storage container 10 can be easily adjusted by changing the numbers of the reinforcing columns.

Of course, unlike the above described case, the lower plate of the wafer storage container 10 can be manufactured in a single lower plate not in a structure wherein the first to third lower plates 400, 500, and 600 are mutually coupled.

Hereinafter, removing the fumes of the wafer W by supplying and exhausting gases using the wafer storage container 10 according to a preferred exemplary embodiment of the present invention having the above described configuration and being coupled with the load port will be described.

First, when the wafer storage container 10 is coupled to the upper side of the load port, the gas supplying nozzles of the load port are coupled to the first and second gas holes 610 and 620 of the third lower plate 600 and being communicated therewith, and the gas exhausting nozzles of the load port are coupled to the third and fourth gas holes 630 and 640 of the third lower plate 600 and being communicated therewith.

Thus, a gas is being supplied from the gas supplying nozzles of the load port, and the gas is introduced to the first gas hole 610, then the gas is flowed to the first communicating hole 450a along the first branch pathway 512 via the first inlet hole 511 and being filled inside the first gas chamber 200a, and then the gas is flowed to the third communicating hole 450c along the second branch pathway 513 and being filled inside the third gas chamber 200c.

Thus, a gas is being supplied from the gas supplying nozzles of the load port, and the gas is introduced to the second gas hole 620, then the gas is flowed to the second communicating hole 450b along the third branch pathway 522 via the second inlet hole 521 and being filled inside the second gas chamber 200b, and then the gas is flowed to the second communicating hole 450b along the fourth branch pathway 523 and being filled inside the fourth gas chamber 200d.

The gas filled respectively inside the first to fourth gas chambers 200a to 200d in this way can be uniformly supplied to the storage chamber 100 due to the supplying pressure of the gas supplying nozzles of the load port and the suction force of the gas exhausting nozzles of the load port.

If described in detail, a supplying pressure is generated when the gas supplying nozzles of the load port are operated in order to respectively fill inside the first to fourth gas chambers 200a to 200d, and a suction force is generated when the gas exhausting nozzles of the load port are operated for exhausting the gas to the fifth and sixth gas chambers 200e and 200f.

Thus, after the gas is respectively filled inside the first to fourth gas chambers 200a to 200d, and being supplied to the storage chamber 100 via the plurality of holes 151 of the first to fourth separating walls 150a to 150d, and then the gas supplied to the storage chamber 100 is being exhausted to the fifth and sixth gas chambers 200e and 200f by the suction force.

As the supplying and exhausting of the gas is continuously accomplished, the flow of gas is occurring in the order of the first to fourth gas chambers 200a to 200d, the storage chamber 100, and the fifth and sixth gas chambers 200e and 200f, and due to the supplying pressure and the suction force the gas filled inside the first to fourth gas chambers 200a to 200d can be uniformly supplied to the storage chamber 100 through the (a sort of) area via the plurality of holes 151 of the first to fourth separating walls 150a to 150d as illustrated in FIG. 11.

Thus, unlike the wafer storage container of the prior art which supplies the gas in the form of lines, the occurrence of a dead zone, wherein the fumes of the wafer W cannot be removed, can be prevented since the gas is not supplied only to a certain region.

In this case, it is preferred that the plurality of holes 151 of the first to fourth separating walls 150a to 150d to have the shape of a m×n matrix, wherein m>3 and the plurality of holes 151 are communicating with one another.

In addition, as described above, the plurality of holes 151 of the first to fourth separating walls 150a to 150d are respectively formed between the plurality of supporting bars 131 supporting the plurality of wafers W along the up-down direction so that the gas can be supplied on each of the plurality of wafers W, thereby removing the fumes of the wafer W more efficiently.

When the gas is supplied to the storage chamber 100 via the plurality of holes 151 of the first to fourth separating walls 150a to 150d, the gas is filled inside the first to fourth gas chambers 200a to 200d, and since the diameter of the plurality of holes 151 is relatively small when compared to the area of the first to fourth separating walls 150a to 150d, the internal pressure of the first to fourth gas chambers 200a to 200d becomes higher than the internal pressure of the storage chamber 100. Due to this, the gas being supplied to the storage chamber 100 obtains high pressure and fast flow rate, so that it has an effect as if the gas is spraying from a nozzle which is not like the gas simply leaking through the plurality of holes 151.

Therefore, the gas can be uniformly supplied up to the central region of the wafer W, due to this, the fumes remaining on the surface of the wafer W stored in the storage chamber 100 can be removed efficiently.

As described above, when the gas is supplied to the storage chamber 100, the fumes remaining on the surface of the wafer W stored inside the storage chamber 100 and the gas that have been supplied are being flowed to the fifth and sixth gas chambers 200e and 200f via the plurality of holes 151 of the fifth and sixth separating walls 150e and 150f.

The gas and the fumes that have been flowed to the fifth gas chamber 200e are being flowed to the third pathway 530 via the fifth communicating hole 450e by the suction force generated from the exhausting nozzles of the load port, and being exhausted to the exhausting nozzles of the load port after passing through the first exhausting hole 531 and the third gas hole 630.

Also, the gas and the fumes that have been flowed to the sixth gas chamber 200f are being flowed to the fourth pathway 540 via the sixth communicating hole 450f by the suction force generated from the exhausting nozzles of the load port, and being exhausted to the exhausting nozzles of the load port after passing through the second exhausting hole 541 and the fourth gas hole 640.

In this way, the gas existing inside the storage chamber and the fumes of the wafer W are being exhausted via the entire fifth and sixth separating walls 150e and 150f located in the rear side of the storage chamber 100, it can be considered as if the gas is being exhausted through the (a sort of) area. Unlike the wafer storage container of the prior art wherein the gas is exhausted in the form of lines, the gas and the fumes of the wafer are not intensively exhausted only through a certain region therefore the gas and the fumes can be exhausted efficiently.

Also, since the gases inside the storage chamber 100 are replaced by the gas continuously supplied from the first to fourth gas chambers 200a to 200d, the cleanness inside the storage chamber 100 can be maintained continuously, and due to this, the oxidation of the wafer W stored inside the storage chamber 100 can be prevented efficiently.

Also, as illustrated in FIG. 11, since supplying and exhausting of the gas are accomplished uniformly through the area of the storage chamber 100 by the plurality of holes 151 of the first to fourth separating walls 150a to 150d and the plurality of holes 151 of the fifth and sixth separating walls 150e and 150f, unlike the wafer storage container of the prior art wherein gases are supplied and exhausted in the form of lines, supplying and exhausting of the gas are not accomplished intensively only within a certain region.

Accordingly, a gas inside the storage chamber 100 is flowing uniformly, therefore the supplying and exhausting of the gas can be accomplished smoothly.

In the case of the above described wafer storage container 10 according to a preferred exemplary embodiment of the present invention, it plays the role of a sort of gas supplying chamber as it supplies a gas from the first to fourth gas chambers 200a to 200d to the storage chamber 10, and the fifth and sixth gas chambers 200e and 200f play the role of a sort of gas exhausting chamber as they exhaust the gas supplied to the storage chamber 100 and the fumes of the wafer W, however, their role can be different depending on the first to fourth gas holes 610, 620, 630, and 640 which will be coupled to the gas supplying nozzles or the gas exhausting nozzles of the load port.

For example, when the first gas hole 610 is coupled to the exhausting nozzle of the load port while the second to fourth gas holes 620 to 640 are coupled to the gas supplying nozzles of the load port, the first and third gas chambers 200a and 200c communicating with the first gas hole 610 play the role of gas exhausting chambers for exhausting the gas and the fumes while the second, fourth, fifth, and sixth gas chambers 200b, 200d, 200e, and 200f play the role of gas supplying chambers for supplying gases.

In this way, depending on how the first to fourth gas holes 610, 620, 630, and 640 are coupled to gas supplying nozzles and/or gas exhausting nozzles of the load port, the flow of gases inside the wafer storage container 10 can be different, and thus the fumes of the wafer W can be removed efficiently corresponding to the state of various wafers W by adjusting the flow of gases inside the wafer storage container 10 according to the manufacturing process of the wafer W.

As described above, although it is described with reference to the preferred exemplary embodiments of the present invention, an ordinary person skilled in the art will appreciate that various modifications and alterations of the present invention are possible without departing from the spirit and scope of the invention.

DESCRIPTION OF SYMBOLS

10: wafer storage container
100: storage chamber
110: cover
130: supporting unit
131: supporting bar
132: rib
135: intermediate member
150a: first separating wall
150b: second separating wall
150c: third separating wall
150d: fourth separating wall
150e: fifth separating wall
150f: sixth separating wall
151: hole
200a: first gas chamber
200b: second gas chamber
200c: third gas chamber
200d: fourth gas chamber
200e: fifth gas chamber
200f: sixth gas chamber
210a: first outer wall
210b: second outer wall
210c: third outer wall
210d: fourth outer wall
210e: fifth outer wall
210f: sixth outer wall
250a: first reinforcing column
250b: second reinforcing column
250c: third reinforcing column
250d: fourth reinforcing column
250e: fifth reinforcing column
251: outer wall coupling groove
252: separating wall coupling groove
300: upper plate
310: outer wall upper part fixing groove
320: separating wall upper part fixing groove
330a: first reinforcing column upper part fixing groove
330b: second reinforcing column upper part fixing groove
330c: third reinforcing column upper part fixing groove
330d: fourth reinforcing column upper part fixing groove
330e: fifth reinforcing column upper part fixing groove
400: first lower plate
410: outer wall lower part fixing groove
420: separating wall lower part fixing groove
430a: first reinforcing column lower part fixing groove
430b: second reinforcing column lower part fixing groove
430c: third reinforcing column lower part fixing groove
430d: fourth reinforcing column lower part fixing groove
430e: fifth reinforcing column lower part fixing groove
450a: first communicating hole
450b: second communicating hole
450c: third communicating hole
450d: fourth communicating hole
450e: fifth communicating hole
450f: sixth communicating hole
500: second lower plate
510: first pathway
511: first inlet hole
512: first branch pathway
513: second branch pathway
514: first communicating portion
515: second communicating portion
520: second pathway
521: second inlet hole
522: third branch pathway
523: fourth branch pathway
524: third communicating portion
525: fourth communicating portion
530: third pathway
531: first exhausting hole
540: fourth pathway
541: second exhausting hole
600: third lower plate
610: first gas hole
620: second gas hole
630: third gas hole
640: fourth gas hole
W: wafer

What is claimed is:

1. A wafer storage container comprising:
a storage chamber storing wafers;
a gas chamber located at an outer side surface of the storage chamber and communicating with the storage chamber,
a first lower plate constituting a bottom surface of the storage chamber and the gas chamber, wherein a communicating hole is formed in the first lower plate;
a second lower plate located at a lower side of the first lower plate, wherein a pathway is formed in the second lower plate; and
a third lower plate located at a lower side of the second lower plate, wherein a gas hole is formed in the third lower plate,
wherein the pathway connects the gas hole and the communicating hole.

2. The wafer storage container according to claim 1, wherein the gas chamber comprises a plurality of gas chambers; the gas hole comprises a plurality of gas holes; at least one of the gas chambers supplies gas to the storage chamber; and at least one of the gas chambers exhausts gas from the storage chamber.

3. The wafer storage container according to claim 1, wherein the gas chamber comprises a plurality of gas chambers; the gas hole comprises a plurality of gas holes; and at least two of the gas chambers are commonly communicating with one of the gas holes.

4. The wafer storage container according to claim 1, wherein the gas hole comprises:

a pair of front gas holes located at a front with respect to a center point of the wafers stored in the storage chamber; and a pair of rear gas holes located at a rear with respect to the center point of the wafers stored in the storage chamber.

5. The wafer storage container according to claim 1, wherein the gas chamber comprises:

a first gas chamber and a second gas chamber located respectively at a front left and a front right of the outer side surface with respect to a center point of the wafers stored in the storage chamber;

a third gas chamber and a fourth gas chamber located respectively at a rear left and a rear right of the outer side surface with respect to the center point of the wafers stored in the storage chamber; and a fifth gas chamber and a sixth gas chamber respectively located at rear sides of the third and the fourth gas chambers and located at a rear of the outer side surface of the storage chamber.

6. The wafer storage container according to claim 5, wherein the first to fourth gas chambers are communicating with front gas holes, and the fifth and sixth gas chambers are communicating with rear gas holes respectively.

7. The wafer storage container according to claim 1, wherein the first lower plate is installed so that the gas hole is not exposed to the storage chamber.

8. The wafer storage container according to claim 1, further comprising a check valve formed between the gas hole and the gas chamber for preventing a reverse flow of gas.

9. The wafer storage container according to claim 1, wherein the storage chamber and the gas chamber are formed to be independent spaces from each other with a separation wall interposed therebetween, and a plurality of holes wherein gas is communicating are formed in a form of a matrix in the separation wall.

10. The wafer storage container according to claim 1, wherein the storage chamber and the gas chamber are formed to be independent spaces from each other with a separation wall interposed therebetween, and a plurality of holes wherein gas is communicating are formed in a zigzag form in the separation wall.

11. The wafer storage container according to claim 1, wherein the storage chamber and the gas chamber are formed to be independent spaces from each other with a separation wall interposed therebetween, and the separation wall is formed to be a curved shape having a curvature.

12. The wafer storage container according to claim 1, further comprising a separation wall located between the storage chamber and the gas chamber and formed with a plurality of holes, wherein an outer wall is spaced apart from the separation wall and has a curvature same as the separation wall, and wherein gas is filled inside the storage chamber via the plurality of holes of the separation wall.

13. The wafer storage container according to claim 1, further comprising a plurality of supporting bars installed in the storage chamber and supporting the wafers.

14. The wafer storage container according to claim 1, wherein the gas chamber comprises a plurality of gas chambers and reinforcing columns are installed between the gas chambers.

* * * * *